(12) United States Patent
Kondo et al.

(10) Patent No.: US 6,830,874 B2
(45) Date of Patent: Dec. 14, 2004

(54) METHOD FOR MAKING LITHOGRAPHIC PRINTING PLATE

(75) Inventors: Shun-ichi Kondo, Shizuoka-Ken (JP); Yuichi Shiraishi, Shizuoka-Ken (JP)

(73) Assignee: Fuji Photo Film Co., Ltd., Minami-Ashigara (JP)

( * ) Notice: Subject to any disclaimer, the term of this patent is extended or adjusted under 35 U.S.C. 154(b) by 33 days.

(21) Appl. No.: 10/188,079

(22) Filed: Jul. 3, 2002

(65) Prior Publication Data

US 2003/0143487 A1 Jul. 31, 2003

(30) Foreign Application Priority Data

Jul. 9, 2001 (JP) ........................................ 2001-208108

(51) Int. Cl.$^7$ .............................. G03F 7/11; G03F 7/32
(52) U.S. Cl. ................. 430/302; 430/271.1; 430/278.1; 430/281.1; 430/286.1; 430/309; 430/435; 430/494
(58) Field of Search ........................... 430/281.1, 286.1, 430/287.1, 288.1, 309, 270.1, 271.1, 278.1, 302, 401, 434, 435, 494

(56) References Cited

U.S. PATENT DOCUMENTS

| | | | | |
|---|---|---|---|---|
| 6,114,089 A | * | 9/2000 | Takita et al. ............. | 430/278.1 |
| 6,440,633 B1 | * | 8/2002 | Kawauchi ................. | 430/270.1 |
| 6,716,569 B2 | * | 4/2004 | Hotta et al. .................. | 430/302 |
| 2002/0039703 A1 | * | 4/2002 | Hotta et al. .................. | 430/302 |
| 2002/0177071 A1 | * | 11/2002 | Okamoto .................. | 430/270.1 |
| 2003/0165768 A1 | * | 9/2003 | Hotta et al. .................. | 430/146 |

FOREIGN PATENT DOCUMENTS

| | | | | | |
|---|---|---|---|---|---|
| EP | 1 013 469 A1 | * | 6/2000 | ............ | B41N/3/03 |
| JP | 10-282645 | * | 10/1998 | ............. | G03F/7/00 |
| JP | 2000-105462 A | * | 4/2000 | ............. | G03F/7/11 |

* cited by examiner

*Primary Examiner*—Barbara L. Gilliam
(74) *Attorney, Agent, or Firm*—Burns, Doane, Swecker & Mathis, L.L.P.

(57) ABSTRACT

A method for preparing a lithographic printing plate which comprises imagewise exposing to light a presensitized plate useful for making a lithographic printing plate having an intermediate layer and a photosensitive layer on an aluminum substrate in this order and developing the imagewise exposed plate with a developer, wherein said intermediate layer comprises a polymer compound comprising at least a structure unit having an acid group and a structure unit having an onium group and said developer comprises an inorganic alkali salt and a nonionic surfactant having polyoxyalkylene ether group and pH of the developer ranges from 11.0 to 12.7. The method provides a lithographic printing plate, which shows good contrast between an image area and non-image area, no background contamination during printing, good stability with time and good printing durability.

12 Claims, No Drawings

METHOD FOR MAKING LITHOGRAPHIC PRINTING PLATE

BACKGROUND OF THE INVENTION

The present invention relates to a method for making a lithographic printing plate from a presensitized plate having a photopolymerizable photosensitive layer on an aluminum substrate. More specifically, the present invention relates to a method for making a lithographic printing plate which shows an improved development performance thus show a resistivity to printing contamination and has an increased strength of image with decreased development damage.

When printings are prepared from a lithographic printing plate, it is important to obtain printings with no background contamination. Generally, the occurrence of background contamination in printings increases with the storage time of a presensitized plate used for making a lithographic printing plate (hereinafter, referred to as PS plate) after production. In particular, this phenomenon becomes more intense when the PS plate has been stored under a high temperature and high humidity. It is particularly difficult to stably store a PS plate having a photopolymerizable photosensitive layer for a long time since free radical easily generates to initiate a chain polymerization reaction in the photopolymerizable photosensitive layer when the PS plate is exposed to light. Accordingly, there has been a demand to obtain a PS plate that can be stably kept for a long time, especially under a high temperature and high humidity and that can provide a lithographic printing plate which does not cause any background contamination.

Many attempts have been made to eliminate the background contamination. For instance, the following PS plates or methods disclosed in various publications are known; a PS plate comprising a basecoat layer consisting of polyvinylphosphonic acid coated on a surface of an anodized aluminum plate and a photosensitive layer coated thereon comprising a diazo compound (German Patent No. 1,621,478), a PS plate comprising a basecoat layer of polyacrylic acid that is coated on an aluminum substrate and a layer of diazo resin coated on the basecoat layer (German Patent No. 1,091,433), a PS plate comprising a basecoat layer of polyacrylamide and a photosensitive layer coated thereon (U.S. Pat. No. 3,511,661), and a method to add an organic acid polymer compound to a photosensitive layer comprising a diazo compound and organic polymer carrier to improve the stability with time of a PS plate comprising the photosensitive layer, thereby inhibiting generation of a background contamination of the PS plate (Japanese Un-examined Patent Publication (hereunder referred to as "J.P. KOKAI") No. Sho 56-107238). However, these PS plates are still insufficient and a further improvement is required. J.P. KOKAI No. Sho 57-5042 discloses a photo-addition composition comprising a combination of a diazo resin having plural diazonium groups on the side chain and a sulfonated polymer comprising plural sulfonate groups (for example, sulfonated polyurethane and sulfonated polyester). However, the effect of the composition to inhibit the background contamination is not sufficient and further, the utility of the PS plate is restricted since the performance of the plate is highly influenced by the sulfonated polyurethane or sulfonated polyester used in the photosensitive layer.

J.P. KOKAI No. 59-101651 discloses a method to improve the background contamination of a PS plate having a photosensitive layer comprising a diazo compound and a photopolymerizable compound when the plate is kept for a long time, which the method comprises coating a polymer comprising a repeating unit having a sulfonic acid as an intermediate layer. The storage stability of the PS plate prepared by the method is enough when the PS plate has a relatively low sensitive photopolymerizable photosensitive layer of which sensitivity which can be treated with the conventional PS plate-exposing device. However, the effect is not sufficient when the PS plate has a highly sensitive photopolymerizable photosensitive layer that is exposed to laser light as used for CTP technique.

The method to deposit a basecoat layer comprising a compound highly soluble in a developer or the method to add such a compound to the photopolymerizable photosensitive layer is effective for improving the background contamination property of a PS plate. But an irradiated portion of the photopolymerizable photosensitive layer of the PS plate is severely damaged by development and the printing durability of the PS plate is also deteriorated.

As a developer for a PS plate having a photopolymerizable photosensitive layer on an aluminum substrate, an aqueous solution of silicate, phosphate, carbonate or hydroxide of an alkali metal or organic amine compound has been proposed.

For example, J.P. KOKAI No. Hei 8-248643 discloses a developer having a high pH of at least 12 and comprising an alkali silicate and an amphoteric surfactant. J.P. KOKAI No. Hei 11-65129 discloses a developer having a pH of 12 or lower, wherein the ratio $SiO_2/M_2O$ (M is alkali metal) is specified.

The former developer having such a high pH has a further problem, in addition to the handling problem, that an image area of the PS plate to be developed is easily damaged. The latter developer has a problem that the contained silicate easily gelates and becomes insoluble due to the decrease of the pH of the developer during the development process.

A developer comprising no alkali silicate is described, for example, in J.P. KOKAI No. Sho 61-109052. The patent application discloses a developer comprising an alkaline agent, a complexing agent, an anionic surfactant, an emulsifying agent and n-alkanoic acid. Another example is described in German Patent No. 1984605 which discloses a developer comprising an alkaline agent, a complexing agent, an anionic surfactant, amyl alcohol, and N-alkoxyamine. However, it is difficult to obtain a good printing performance such as printing durability since both the developers have high pH and comprise an organic solvent which causes damages of image area.

A developer having a relatively low pH (12 or less) with no alkali silicate is described, for example, in J.P.KOKAI No.2000-81711 which discloses a developer comprising an aqueous solution of potassium hydroxide comprising an anionic surfactant, and in J.P. KOKAI No. Hei 11-65126 that discloses a developer comprising an aqueous solution of alkali metal carbonate having a pH ranging from 8.5 to 11.5.

However, such a developer having a relatively low pH poorly dissolves photopolymerizable photosensitive layer and thus, may cause problems such as a remain of a film in a non-image area of the photosensitive layer, particularly when the utilized PS plate is an aged one (that is, the plate has been stored for a long time after production). In order to solve the problem, it is necessary to improve the development performance by increasing an acid number of a binder polymer in the photosensitive layer of the PS plate, or by use of an additional monomer having an acid group in the binder polymer. But, when such a binder polymer having a higher acid number is used, it often causes a problem in a printing process such as a blinding, that is, ink does not adhere to the PS plate during the printing process.

SUMMARY OF THE INVENTION

Thus, the purpose of the present invention is to provide a method for making a lithographic printing plate which has a stability with time and does not cause any background contamination when the plate is used to make printings after exposed to light and developed, and even when the plate is kept for a long time under a high temperature and high humidity. More specifically, the purpose of the present invention is to provide a PS plate useful for making a lithographic printing plate and to provide a preparation method therefor, wherein the lithographic printing plate shows a stable and good development performance even if the PS plate has been developed with an alkali developer having a relatively low pH preferably used from the viewpoint of environmental protection and safety, and the lithographic printing plate shows an increased image strength and causes no background contamination during printing process and no damage in the image area during development process.

The inventors of the present invention have found that a lithographic printing plate shows a resistivity to background contamination when the PS plate comprises an intermediate layer comprising a polymer comprising a structure unit having an acid group and a structure unit having an onium group and the PS plate is developed with an developer comprising a specific nonionic surfactant in an aqueous alkali solution having a relatively low pH. In addition, dissolution rate of non-exposed area of the photopolymerizable photosensitive layer is increased by the method and penetration of the developer is inhibited around the photo-crosslinked image portion to thus give a strong film.

Thus, the present invention provides a method for preparing a lithographic printing plate which comprises imagewise exposing to light a presensitized plate useful for making a lithographic printing plate having an intermediate layer and a photosensitive layer on an aluminum substrate in this order and developing the imagewise exposed plate with a developer, wherein said intermediate layer comprises a polymer compound comprising a structure unit having an acid group and a structure unit having an onium group and said developer comprises an inorganic alkali salt and a nonionic surfactant having polyoxyalkylene ether group and pH of the developer ranges from 11.0 to 12.7.

By such a method, it becomes possible to obtain a lithographic printing plate that does not cause any background contamination even it is kept for a long time and image portion of the plate becomes strong film to thus give a good printing durability and a resistance to a solvent.

DESCRIPTION OF THE PREFERRED EMBODIMENTS

Hereinafter, the present invention is explained in detail.
(Intermediate Layer)

One of the characteristics of the present invention is that an intermediate layer comprises a polymer compound comprising a structure unit having an acid group and a structure unit having an onium group. The lithographic printing plate prepared from a PS plate comprising such an intermediate shows no background contamination even after it is kept for a long time and an improved printing durability.

The polymer compound used in the present invention is prepared by, for example, polymerizing at least a monomer component comprising an acid group and a monomer component comprising an onium group. A preferred example of the acid group is that having an acid dissociation constant (pKa) of 7 or less. More preferable examples of the acid group include —COOH, —SO$_3$H, —OSO$_3$H, —PO$_3$H$_2$, —OPO$_3$H$_2$, —CONHSO$_2$—, and —SO$_2$NHSO$_2$—. Particularly preferred group is —COOH. Preferred examples of the onium group include those comprising atoms of group 5 or group 6 in the periodic table. More preferable examples of onium group are those comprising nitrogen atom, phosphorus atom, or sulfur atom. Most preferable example is an onium group comprising nitrogen atom, i.e., ammonium group.

Preferably, the main chain of the polymer of the present invention is a vinyl polymer such as acrylic resin, methacrylic resin and polystyrene, urethane resin, polyester or polyamide. More preferably, the main chain of the polymer is a vinyl polymer such as acrylic resin, methacrylic resin and polystyrene. A particularly preferred chain is a polymer having a structure unit having an acid group, which is derived from the compound represented by the following general formula (1) or (2) and a structure unit having an onium group, which is derived from the compound represented by the following general formula (3), (4) or (5).

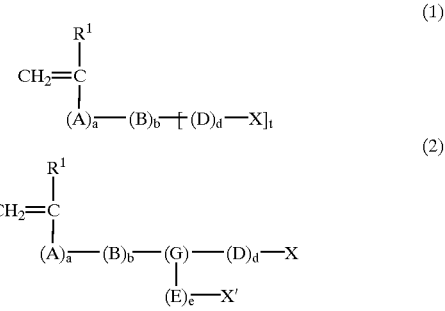

In the above formula, A is a bivalent connecting group; B is a bivalent, trivalent or tetravalent aromatic or substituted aromatic group; D and E each independently represents a bivalent connecting group; G is a trivalent connecting group; X and X' each independently represents an acid group having pKa of 7 or less or an alkali metal salt or ammonium salt thereof; R$^1$ is a hydrogen atom, alkyl group or halogen atom; "a", "b", "d" and "e" each independently represents 0 or 1; and "t" is 1 to 3.

Preferably, A is —COO— or —CONH—; B is a phenylene group or substituted phenylene group wherein the substituent is a hydroxy group, halogen atom or alkyl group; D and E each independently represents an alkylene group or a bivalent connecting group represented by the molecular formula of $C_nH_{2n}O$, $C_nH_{2n}S$, or $C_nH_{2n+1}$, N; G is a trivalent connecting group represented by the molecular formula of $C_nH_{2n-1}$, $C_nH_{2n-1}O$, $C_nH_{2n-1}S$ or $C_nH_{2n}N$, wherein "n" is 1 to 12; X and X' each independently represents a carboxylic acid, sulfonic acid, phosphonic acid, sulfuric acid mono ester or phosphoric acid mono ester; R' is a hydrogen atom or alkyl group; "a", "b", "d" and "e" each independently represents 0 or 1, provided that "a" and "b" are not simultaneously 0.

A particularly preferred structure unit having an acid group is a compound represented by the general formula (1), wherein B is a phenylene group or substituted phenylene group wherein the substituent is a hydrogen group or C1 to C3 alkyl group; D and E each independently represents C1 or C2 alkylene group or C1 or C2 alkylene group which is connected through an oxygen atom; $R^1$ is a hydrogen atom or methyl group; X is a carboxylic acid group; "a" is 0; and "b" is 1.

Specific examples of the structure unit having an acid group are shown below, but they are not limited thereto.

(Specific Examples of the Structure Unit Having an Acid Group)

Acrylic acid, methacrylic acid, crotonic acid, isocrotonic acid, itaconic acid, maleic acid, maleic anhydride,

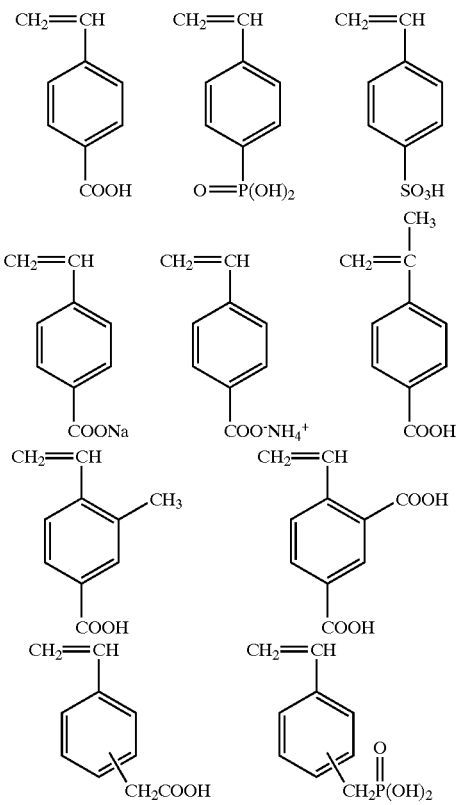

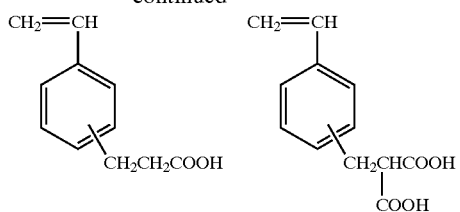

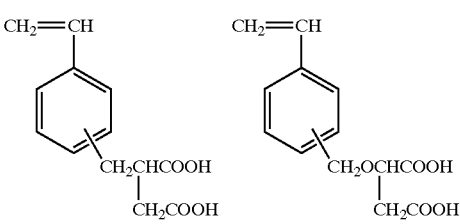

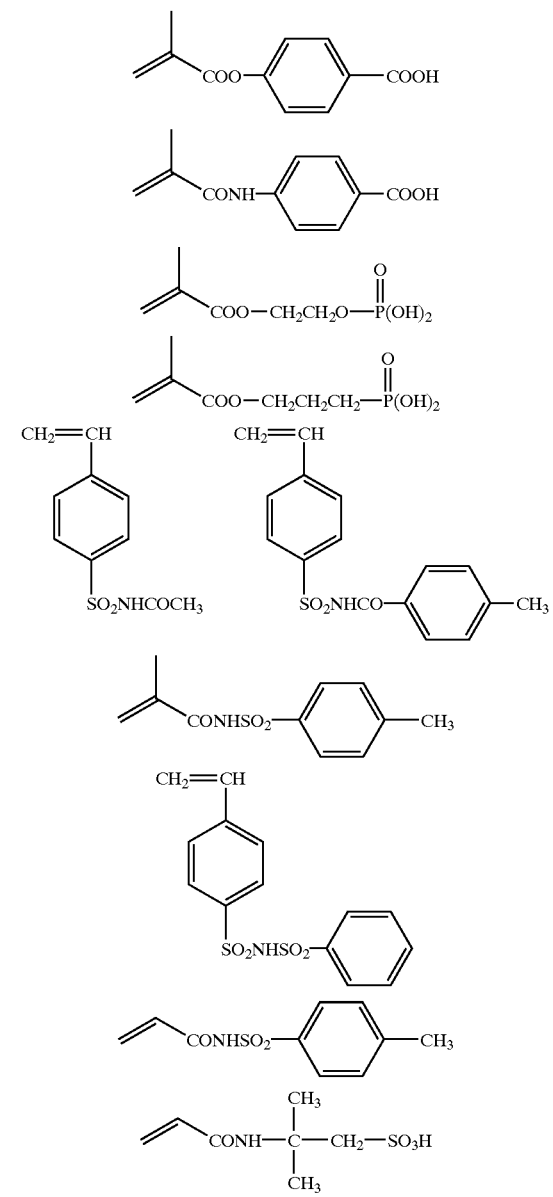

-continued

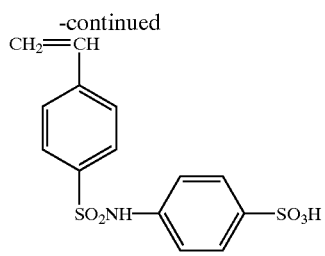

Hereinafter, the polymer comprising a structure unit having an onium group, which is derived from the compound represented by the general formula (3), (4) or (5) will be explained.

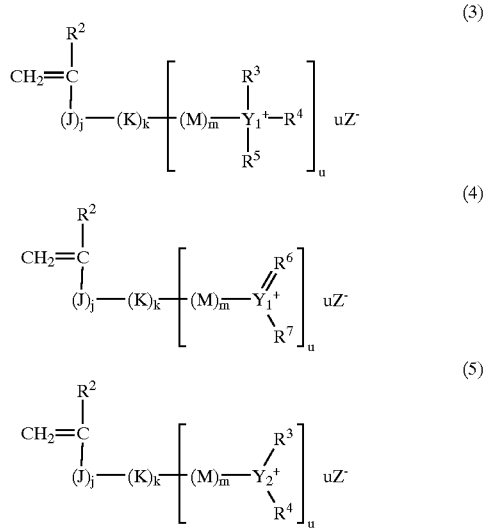

In the formula, J is a bivalent connecting group; K is a bivalent, trivalent or tetravalent aromatic or a substituted aromatic group; M independently represents a bivalent connecting group; $Y_1$ is an atom of group 5 in the periodic table; $Y_2$ is an atom of group 6 in the periodic table; $Z^-$ is a counter anion; $R^2$ is a hydrogen atom, alkyl group or halogen atom; $R^3$, $R^4$, $R^5$ and $R^7$ each independently represents a hydrogen atom or an optionally substituted alkyl group, aromatic group, or aralkyl group; $R^8$ is an alkylidene group or substituted alkylidene group; $R^3$ and $R^4$, or $R^6$ and $R^7$ may be linked together to form a ring; "j", "k" and "m" each independently represents 0 or 1; and "u" is 1 to 3.

Preferably, J is —COO— or —CONH—; K is a phenylene group or a substituted phenylene group wherein the substituent is a hydroxy group, halogen atom or alkyl group; M is an alkylene group or a bivalent connecting group having the molecular formula of $C_nH_{2n}O$, $C_nH_{2n}S$ or $C_nH_{2n+1}N$, wherein "n" is 1 to 12; $Y_1$ is a nitrogen atom or phosphorus atom; $Y_2$ is a sulfur atom; $Z^-$ is a halogen ion, $PF_6^-$, $BF_4^-$ or $R^8SO_3^-$; $R^2$ is a hydrogen atom or alkyl group; $R^3$, $R^4$, $R^5$ and $R^7$ each independently represents a hydrogen atom or optionally substituted C1 to C10 alkyl group, aromatic group, or aralkyl group; $R^6$ is a C1 to C10 alkylidene group or substituted alkylidene group; $R^3$ and $R^4$, or $R^6$ and $R^7$ may be linked together to form a ring; "j", "k" and "m" each independently represents 0 or 1 provided that "j" and "k" are not simultaneously 0; and $R^8$ is an optionally substituted C1 to C10 alkyl group, aromatic group, or aralkyl group.

Particularly preferred examples among the above are the compounds wherein K is a phenylene group or substituted phenylene group wherein the substituent is a hydroxy group or C1 to C3 alkyl group; M is C1 or C2 alkylene group or C1 or C2 alkylene group connected via an oxygen group; $Z^-$ is a chloride ion or $R^8SO_3^-$; $R^2$ is a hydrogen atom or methyl group; "j" is 0; "k" is 1; and $R^8$ is C1 to C3 alkyl group.

Specific examples of the structure unit having an onium group are shown below, but they are not limited thereto.

(Specific Examples of the Structure Unit Having an Onium Group)

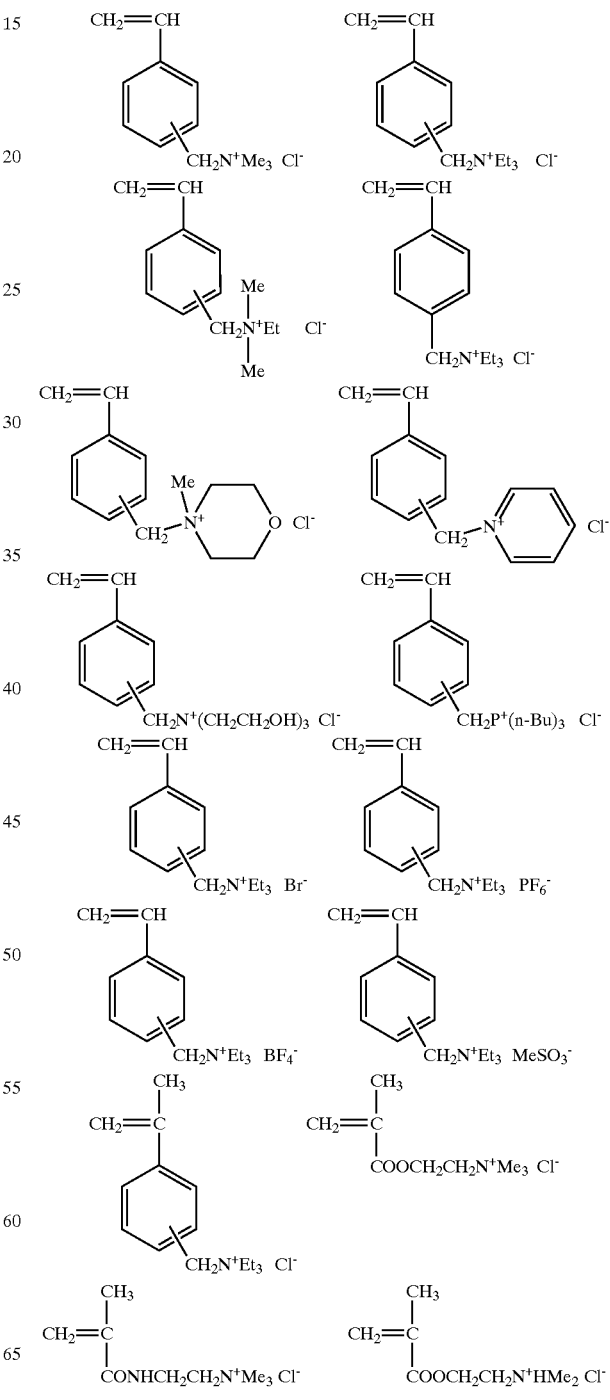

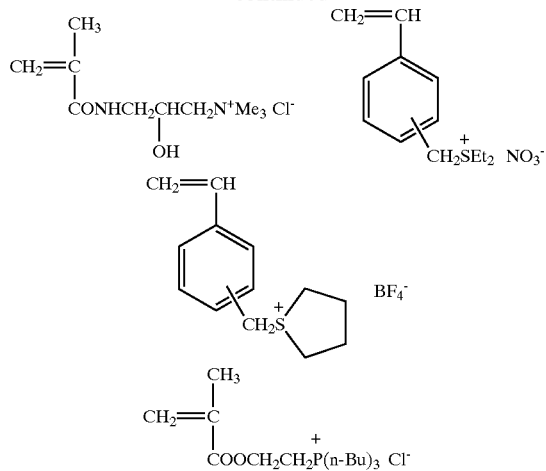

In addition, the polymer may further comprise as a copolymer component at least one polymerizable monomer selected from the following (1) to (4);

(1) acrylamides, methacrylamides, acrylic acid esters, methacrylic acid esters and hydroxystyrenes having an aromatic hydroxy group such as N-(4-hydroxyphenyl) acrylamide or N-(4-hydroxyphenyl)methacrylamide, o-, m- or p-hydroxystyrene, o- or m-bromo-p-hydroxystyrene, o- or m-chloro-p-hydroxystyrene, o-, m- or p-hydroxyphenyl acrylate or methacrylate and the like, (2) unsaturated carboxylic acid such as acrylic acid, methacrylic acid, maleic acid, maleic anhydride and a half ester thereof, itaconic acid, and itaconic anhydride and a half ester thereof, (3) unsaturated sulfonamide of acrylamids such as N-(o-aminosulfonylphenyl)acrylamide, N-(m-aminosulfonylphenyl)acrylamide, N-(p-aminosulfonylphenyl)acrylamide, N-[1-(3-aminosulfonyl) naphthyl] acrylamide, N-(2-aminosulfonylethyl)acrylamide and the like; of methacrylamids such as N-(o-aminosulfonylphenyl)methacrylamide, N-(m-aminosulfonylphenyl)methacrylamide, N-(p-aminosulfonylphenyl)methacrylamide, N-[1-(3-aminosulfonyl)naphthyl]methacrylamide, N-(2-aminosulfonylethyl)-methacrylamide and the like; of acrylic acid esters such as o-aminosulfonylphenyl acrylate, m-aminosulfonylphenyl acrylate, p-aminosulfonylphenyl acrylate, 1-(3-aminosulfonylphenylnaphthyl) acrylate and the like; and of methacrylic acid esters such as o-aminosulfonylphenyl methacrylate, m-aminosulfonylphenyl methacrylate, p-aminosulfonylphenyl methacrylate, 1-(3-aminosulfonylphenylnaphthyl) methacrylate and the like, (4) phenylsulfonylacrylamide that may have a substituent such as tosylacrylamide and phenylsulfonylmethacrylamide that may have a substituent such as tosylmethacrylamide.

In addition to the monomers comprising an alkaline-soluble group, the following film-forming resin prepared by copolymerizing the monomer described in (5) to (14);

(5) acrylic acid esters or methacrylic acid esters having an aliphatic hydroxy group, e.g., 2-hydroxyethyl acrylate or 2-hydroxyethyl methacrylate, (6) (substituted) acrylic ester such as methyl acrylate, ethyl acrylate, propyl acrylate, butyl acrylate, amyl acrylate, hexyl acrylate, cyclohexyl acrylate, octyl acrylate, phenyl acrylate, benzyl acrylate, 2-chloroethyl acrylate, 4-hydroxybutyl acrylate, glycidyl acrylate, N-dimethylaminoethyl acrylate and the like, (7) (substituted) methacrylic acid ester such as methyl methacrylate, ethyl methacrylate, propyl methacrylate, butyl methacrylate, amyl methacrylate, hexyl methacrylate, cyclohexyl methacrylate, octyl methacrylate, phenyl methacrylate, benzyl methacrylate, 2-chloroethyl methacrylate, 4-hydroxybutyl methacrylate, glycidyl methacrylate, N-dimethylaminoethyl methacrylate and the like, (8) acrylamide or methacrylamide such as acrylamide, methacrylamide, N-methylolacrylamide, N-methylolmethacrylamide, N-ethylacrylamide, N-ethylmethacrylamide, N-hexylacrylamide, N-hexylmethacrylamide, N-cyclohexylacrylamide, N-cyclohexylmethacrylamide, N-hydroxyethylacrylamide, N-hydroxyethylacrylamide, N-phenylacrylamide, N-phenylmethacrylamide, N-benzylacrylamide, N-benzylmethacrylamide, N-nitrophenylacrylamide, N-nitrophenylmethacrylamide, N-ethyl-N-phenylacrylamide, N-ethyl-N-phenylmethacrylamide and the like, (9) vinyl ethers such as ethyl vinyl ether, 2-chloroethyl vinyl ether, hydroxyethyl vinyl ether, propyl vinyl ether, butyl vinyl ether, octyl vinyl ether, phenyl vinyl ether and the like,

(10) vinyl esters such as vinyl acetate, vinyl chloroacetate, vinyl butyrate, vinyl benzoate and the like,

(11) styrenes such as styrene, α-methylstyrene, methylstyrene, chloromethylstyrene and the like,

(12) vinyl ketones such as methyl vinyl ketone, ethyl vinyl ketone, propyl vinyl ketone, phenyl vinyl ketone and the like,

(13) olefines such as ethylene, propylene, isobutylene, butadiene, isoprene and the like, and

(14) N-vinylpyrrolidone, N-vinylcarbazole, 4-vinylpyridine, acrylonitrile, methacrylonitrile and the like.

The polymer of the present invention desirably contains 20% by mole or more and more preferably 40% by mole or more of the structure unit having an acid group, and contains 1% by mole or more and more preferably 5% by mole or more of the structure unit having an onium group. If the polymer contains 20% by mole or more of the structure unit having an acid group, dissolution of the polymer to the alkaline developer will be promoted. If the polymer contains 1% by mole or more of the structure unit having an onium group, adhesiveness of the polymer is increased as a synergistic effect with the acid group. The polymer may comprise one or more structure units having an acid group and the polymer may comprise one or more structure units having an onium group. In addition, the polymer of the present invention may be a mixture of two or more polymers that are different in its structure unit, ratio thereof or molecular weight.

The followings are the representative polymers of the present invention. The number described in the structure unit represents mole percent.
| | Structure | Number average molecular weight (Mn) |
|---|---|---|
| No. 1 | 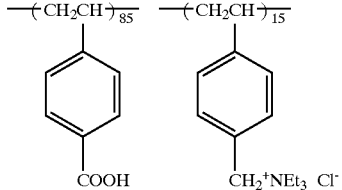 | 2,100 |
| No. 2 | 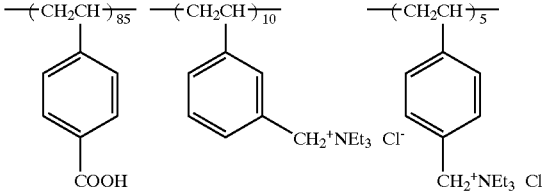 | 4,800 |
| No. 3 | 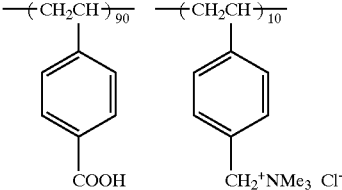 | 3,200 |
| No. 4 | 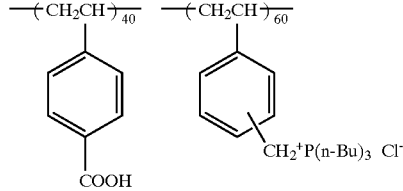 | 2,300 |
| No. 5 | 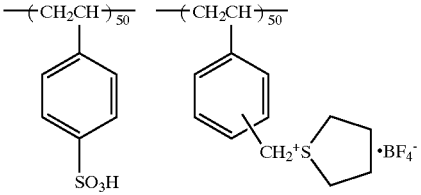 | 1,400 |
| No. 6 | 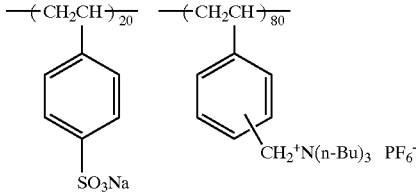 | 4,500 |
| No. 7 | 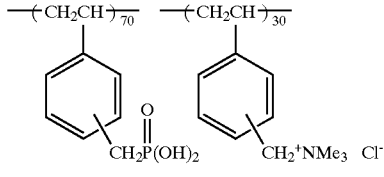 | 5,000 |

-continued

| | Structure | Number average molecular weight (Mn) |
|---|---|---|
| No. 8 | —(CH$_2$CH)$_{60}$— —(CH$_2$CH)$_{30}$— —(CH$_2$CH)$_{10}$—  with phenyl-COOH, phenyl-CH$_2^+$NEt$_3$ Br$^-$, phenyl | 1,000 |
| No. 9 | —(CH$_2$C(CH$_3$))$_{20}$— —(CH$_2$C(CH$_3$))$_{70}$— —(CH$_2$C(CH$_3$))$_{10}$— with COOH, COOCH$_3$, COOCH$_2$CH$_2^+$N(CH$_3$)$_3$ Cl$^-$ | 1,300 |
| No. 10 | —(CH$_2$CH)$_{20}$—COOH, —(CH$_2$CH)$_{15}$—phenyl-CH$_2$-$^+$N(pyridinium) Cl$^-$, —(CH$_2$CH)$_{15}$—phenyl-CH$_2$-$^+$N(morpholinium-CH$_3$) Cl$^-$ | 2,900 |
| No. 11 | —(CH$_2$C(CH$_3$))$_{30}$—COO-phenyl-COOH, —(CH$_2$C(CH$_3$))$_{70}$—COOCH$_2$CH$_2^+$NEt$_3$ Br$^-$ | 800 |
| No. 12 | —(CH$_2$C(CH$_3$))$_{55}$—COOCH$_2$CH$_2$OP(O)(OH)$_2$, —(CH$_2$C(CH$_3$))$_{45}$—CONHCH$_2$CH(OH)CH$_2^+$N(CH$_3$)$_3$ Cl$^-$ | 300 |
| No. 13 | —(CH$_2$C(CH$_3$))$_{95}$—CONH-phenyl-COOH, —(CH$_2$CH)$_{5}$—phenyl-CH$_2^+$SEt$_2$ PF$_6^-$ | 1,900 |
| No. 14 | —(CH$_2$CH)$_{30}$—CONH—C(CH$_3$)$_2$—CH$_2$—SO$_3$H, —(CH$_2$C(CH$_3$))$_{30}$—COOCH$_2$CH$_2$OH, —(CH$_2$C(CH$_3$))$_{40}$—COOCH$_2$CH$_2^+$NH(CH$_3$)$_2$ Br$^-$ | 4,100 |
| No. 15 | —(CH$_2$CH)$_{75}$—phenyl-SO$_2$NHCO-phenyl-CH$_3$, —(CH$_2$CH)$_{25}$—(N-methylpyridinium) CH$_3$ I$^-$ | 3,500 |

-continued

| | Structure | Number average molecular weight (Mn) |
|---|---|---|
| No. 16 | [structure with -(CH₂C(CH₃))₃₀- with CONHSO₂-C₆H₄-CH₃ side chain, -(CH₂CH)₄₀- with CN side chain, -(CH₂C(CH₃))₃₀- with COOCH₂CH₂⁺P(n-Bu)₃Cl⁻ side chain] | 3,000 |
| No. 17 | [structure with -(CH₂CH)₁₀- with C₆H₄-COOH side chain, -(CH₂CH)₈₀- with C₆H₄-CH₂P(O)(OH)₂ side chain, -(CH₂CH)₁₀- with C₆H₄-CH₂⁺PPh₃ Cl⁻ side chain] | 3,300 |
| No. 18 | [structure with -(CH₂CH)₄₀- with COOH side chain, -(CH₂CH)₄₀- with CONH-C₆H₄-COOH side chain, -(CH₂C(CH₃))₂₀- with COOCH₂CH₂⁺PEt₃ Cl⁻ side chain] | 600 |
| No. 19 | [structure with -(CH₂CH)₅₀- with COOH side chain, -(CH₂CH)₂₀- with COOCH₂-C₆H₅ side chain, -(CH₂CH)₃₀- with C₆H₄-CH₂⁺N(n-Bu)₃ Br⁻ side chain] | 5,000 |
| No. 20 | [structure with -(CH₂C(CH₃))₆₀- with CONHSO₂-C₆H₄-CH₃ side chain, -(CH₂CH)₂₀- with COOCH₃ side chain, -(CH₂CH)₂₀- with C₆H₄-CH₂⁺NEt₃ I⁻ side chain] | 2,400 |

Typically, the polymer of the present invention can be prepared by a radical chain polymerization method. See, "Textbook of Polymer Science" 3rd ed., (1984) F. W. Billmeyer, A Wiley-Interscience Publication. The number average molecular weight (Mn) of the polymer of the present invention, that is calculated from the integrated intensity of the terminal group and functional group at side chain observed in NMR analysis, is in the range of 300 to 5,000, preferably from 500 to 4,800 and more preferably from 800 to 4,500. If Mn is below 300, the adhesiveness of the polymer to the substrate becomes decreased to result in deterioration of the printing durability. If Mn is beyond 5,000, the adhesiveness to the substrate becomes too strong to result in insufficient removal of the non-image area and to result in deterioration of cleaning property. The amount of the unreacted monomer in the polymer may be in a wide range but preferably up to 20% by weight and more preferably up to 10% by weight.

When the polymer is prepared by copolymerizing the corresponding monomers, a polymerization initiator and/or chain transfer agent can be added to the reaction mixture to control the molecular weight of the polymer. The chain transfer agent is a substance that transfers the active point in the polymerization reaction by chain transfer reaction. The occurrence of the transfer reaction is indicated by the chain transfer constant, Cs. The chain transfer constant $Cs \times 10^4$ (at 60° C.) of the chain transfer agent used in the present invention is preferably 0.01 or higher, more preferably 0.1 or higher and most preferably 1 or higher. A polymerization initiator generally utilized in the radical polymerization such as peroxide, azo compound and redox initiator can be utilized. Among them, azo compound is particularly preferred.

Examples of chain transfer agents include halogenized compounds such as carbon tetrachloride, carbon tetrabromide and the like, alcohols such as isopropyl alcohol, isobutyl alcohol and the like, olefines such as 2-methyl-1-butene, 2,4-diphenyl-4-methyl-1-pentene and the like, sulfur compounds such as ethanethiol, butanethiol, dodecanethiol, mercaptoethanol, mercaptopropanol, methyl mercaptopropionate, ethyl mercaptopropionate, mercaptopropionic acid, thioglycolic acid, ethyl disulfide, sec-butyl disulfide, 2-hydroxyethyl disulfide, thiosalicylic acid, thiophenol, thiocresol, benzylmercaptan, phenethylmercaptan and the like, but not limited thereto. Preferred compounds are ethanethiol, butanethiol, dodecanethiol, mercaptoethanol, mercaptopropanol, methyl mercaptopropionate, ethyl mercaptopropionate, mercaptopropionic acid, thioglycolic acid, ethyl disulfide, sec-butyl disulfide, 2-hydroxyethyl disulfide, thiosalicylic acid, thiophenol, thiocresol, benzylmercaptan, phenethylmercaptan and the like, but not limited thereto. More preferred compounds are ethanethiol, butanethiol, dodecanethiol, mercaptoethanol, mercaptopropanol, methyl mercaptopropionate, ethyl mercaptopropionate, mercaptopropionic acid, thioglycolic acid, ethyl disulfide, sec-butyl disulfide, and 2-hydroxyethyl disulfide.

The intermediate layer comprising the above polymer compounds can be coated on an aluminum substrate by various methods, which the substrate has been previously subjected to treatment to obtain a hydrophilic surface.

For example, the intermediate layer can be coated by the following methods. A solution of the polymer compound described above in an organic solvent such as methanol, ethanol, and methyl ethyl ketone or a mixture thereof or in a mixture of said organic solvent and water, is coated on an aluminum substrate and then is dried. An aluminum substrate is immersed in a solution of the polymer compound described above in an organic solvent such as methanol, ethanol, and methyl ethyl ketone or a mixture thereof or in a mixture of said organic solvent and water, and then is washed with water and/or air-dried.

In the former method, a solution comprising said compounds in a total amount of 0.005% to 10% by weight can be applied onto the aluminum surface by a variety of methods. Examples of the method include bar coating, roll coating, spray coating, flood coating and the like. In the latter method, the concentration of the solution may range from 0.005% to 20% by weight, preferably from 0.01% to 10% by weight at the immersing temperature of 0° C. to 70° C., preferably from 5° C. to 60° C. for 0.1 second to 5 minutes, preferably from 0.5 second to 120 seconds.

The pH of the solution for the intermediate layer can be controlled by adding to the solution the following materials; a basic compound such as ammonia, triethylamine, and potassium hydroxide, an inorganic acid such as hydrochloric acid, phosphoric acid, sulfuric acid and nitric acid, an organic acidic compound, e.g., an organic sulfonic acid such as nitrobenzenesulfonic acid, naphthalenesulfonic acid, an organic phosphonic acid such as phenylphosphonic acid, and an organic carboxylic acid such as benzoic acid, fumaric acid, and malic acid, and an organic chloride such as naphthalenesulfonyl chloride, and benzenesulfonyl chloride. The pH of the solution may range from 0 to 12 and preferably from 0 to 6. The solution may further comprise a material that absorbs ultraviolet light, visible light or infrared radiation to improve a property as to tone reproduction of the PS plate.

The total amount of the compound that makes up the intermediate layer after being dried ranges suitably from 1 Mg/m$^2$ to 100 mg/m$^2$, and preferably from 2 mg/m$^2$ to 70 mg/m$^2$. If the coating amount is below 1 mg/m$^2$, the intermediate layer does not work well. If the coating amount is beyond 100 mg/m$^2$, also the intermediate layer does not work well.

(Photosensitive Layer)

The photopolymerizable photosensitive layer usable in the present invention is prepared from photopolymerizable photosensitive composition (hereinafter, referred to as "photopolymerizable composition"). The photopolymerizable composition comprises an addition polymerizable or ethylenically unsaturated bond-containing compound, a photopolymerization initiator, and a polymer binder, and optionally comprises a variety of compounds such as a coloring agent, plasticizer, heat polymerization inhibitor and the like.

The ethylenically unsaturated bond in the ethylenically unsaturated bond-containing compound can be addition polymerized to cross-link or cure the compound when the photopolymerizable composition is exposed to active light. The compound comprising the addition polymerizable or ethylenically unsaturated bond may be selected from the group consisting of compounds comprising at least one, preferably two or more terminal ethylenically unsaturated bonds, which the compounds are in the form of, for example, a monomer, prepolymer (i.e., oligomer such as a dimer and trimer), copolymer and a mixture thereof.

Examples of the monomer and copolymer comprising an ethylenically unsaturated bond include an ester of unsaturated carboxylic acid (e.g., acrylic acid, methacrylic acid, itaconic acid, crotonic acid, isocrotonic acid, and maleic acid) and aliphatic polyol, and an amide of unsaturated carboxylic acid and aliphatic polyamine. Examples of the ester of unsaturated carboxylic acid and aliphatic polyol include an acrylic acid ester such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythyritol diacrylate, pentaerythyritol triacrylate, pentaerythyritol tetraacrylate, dipentaerythyritol diacrylate, dipentaerythyritol pentaacrylate, dipentaerythyritol hexaacrylate, sorbitol triacrylate, sorbitol tetraacrylate, sorbitol pentaacrylate, sorbitol hexaacrylate, tri (acryloyloxyethyl)isocyanulate, polyester acrylate oligomer and the like.

Examples of methacrylic acid ester include tetramethylene glycol dimethacrylate, triethylene glycol dimethacrylate, neopentyl glycol dimethacrylate, trimethylolpropane trimethacrylate, trimethylolethane methacrylate, ethylene glycol dimethacrylate, 1,3-butanediol dimethacrylate, hexanediol dimethacrylate, pentaerythyritol dimethacrylate, pentaerythyritol trimethacrylate, pentaerythyritol tetramethacrylate, dipentaerythyritol dimethacrylate, dipentaerythyritol hexamethacrylate, dipentaerythyritol pentamethacrylate, sorbitol trimethacrylate, sorbitol tetramethacrylate, bis[p-(3-methacryloxy-2-hydroxypropoxy)phenyl]dimethylmethane, bis-[p-(methacryloxyethoxy)phenyl]dimethylmethane and the like.

Examples of itaconic acid ester include ethylene glycol diitaconate, propylene glycol diitaconate, 1,5-butanediol diitaconate, 1,4-butanediol diitaconate, tetramethylene glycol diitaconate, pentaerythyritol diitaconate, sorbitol tetraitaconate and the like.

Examples of crotonic acid ester include ethylene glycol dicrotonate, tetramethylene glycol dicrotonate, pentaerythyritol dicrotonate, sorbitol tetradicrotonate and the like.

Examples of isocrotonic acid ester include ethylene glycol diisocrotonate, pentaerythyritol diisocrotonate, sorbitol tetraisocrotonate and the like.

Examples of maleic acid ester include ethylene glycol dimaleate, triethylene glycol dimaleate, pentaerythyritol dimaleate, sorbitol tetramaleate and the like. Further, mixtures of the aforementioned ester monomers are also included.

Examples of amide of aliphatic polyamine compound and unsaturated carboxylic acid include methylenebisacrylamide, methylenebismethacrylamide, 1,6-hexamethylenebis-acrylamide, 1,6-hexamethylenebismethacrylamide, diethylenetriaminetrisacrylamide, xylylenebisacrylamide, xylylenebismethacrylamide and the like. Other examples include vinylurethane compound comprising two or more polymerizable vinyl groups in a molecule, prepared by an addition reaction of a vinyl monomer having a hydroxyl group represented by the following formula (A) with a polyisocyanate compound having two or more isocyanate groups as disclosed in Japanese Patent Publication for Opposition Purpose (hereunder referred to as "J.P. KOKOKU") No. Sho 48-41708.

$$CH_2=C(R)COOCH_2CH(R')OH \quad (A)$$

wherein R and R' each represents H or $CH_3$.

Also, urethane acrylates as described in J.P. KOKAI No. Sho 51-37193, J.P. KOKOKU No. Hei 2-32293, polyfunctional acrylates or methacrylates such as epoxycrylate prepared from epoxy resin and (meth)acrylic acid, and polyester acrylates as described in J.P. KOKAI No. Sho 48-64183, J.P. KOKOKU No. Sho 49-43191, and J.P. KOKOKU No. Sho 52-30490, can be utilized as the compound comprising an ethylenically unsaturated bond. In addition, a photo-setting monomer and oligomer as described in "Bulletin of Japan Adhesive Association Vol.20, No.7, p. 300–308 (1984)" can be utilized. The amount of the ethylenically unsaturated bond-containing compound ranges 5% to 80% by weight and preferably from 30% to 70% by weight on the basis of the total weight of the photosensitive layer.

The initiator of photopolymerization usable in the photosensitive layer in the PS plate of the present invention can be selected from various initiators of photopolymerization reported in many patents and publications, or from various combinations of two or more initiators of photopolymerization (photoinitiation system), depending on the wavelength of the light source to be used. Specific examples thereof will be described below, but not limited thereto.

There have been proposed various photoinitiation systems which can be used for visible light rays having 400 nm or longer, Ar laser, secondary harmonics of semiconductor laser, or SHG-YAG laser as a light source. For instance, a certain dye capable of being photolytically reduced such as Rose Bengale, Eosine, and Erythrosine (U.S. Pat. No. 2,850,445); a combination system of a dye and an initiator such as a combined initiator system comprising a dye and an amine (J.P. KOKOKU No. Sho 44-20189); a system comprising hexaarylbiimidazole, a radical initiator and a dye (J.P. KOKOKU No. Sho 45-37377); a system comprising a hexaarylbiimidazole and a p-dialkylaminobenzylidene ketone (J.P. KOKOKU No. Sho 47-2528 and J.P. KOKAI No. Sho 54-155292); a system comprising a cyclic cis-α-dicarbonyl compound and a dye (J.P. KOKAI No. Sho 48-84183); a system comprising a substituted triazine and a merocyanine dye (J.P. KOKAI No. Sho 54-15102); a system comprising a 3-keto-substituted coumarin compound and an active halogen atom-containing compound (J.P. KOKAI No. Sho 52-112681, J.P. KOKAI No. Sho 58-15503); a system comprising biimidazole, styrene derivative, and thiol (J.P. KOKAI No. Sho 59-140203); a system comprising an organic peroxide compound and a pigment (J.P. KOKAI No. Sho 59-1504, J.P. KOKAI No. Sho 59-140203, J.P. KOKAI No. Sho 59-189340, J.P. KOKAI No. Sho 62-174203, J.P. KOKOKU No. Sho 62-1641, U.S. Pat. No. 4,766,055); a system comprising a dye and an active halogenated compound (J.P. KOKAI No. Sho 63-258903, J.P. KOKAI No. Hei 2-63054 and the like); a system comprising a dye and a borate compound (J.P. KOKAI No. Sho 62-143044, J.P. KOKAI No. Sho 62-150242, J.P. KOKAI No. Sho 64-13140, J.P. KOKAI No. Sho 64-13141, J.P. KOKAI No. Sho 64-13142, J.P. KOKAI No. Sho 64-13143, J.P. KOKAI No. Sho 64-13144, J.P. KOKAI No. Sho 64-17048, J.P. KOKAI No. Hei 1-229003, J.P. KOKAI No. Hei 1-298348, J.P. KOKAI No. Hei 1-138204 and the like); a system comprising a dye having a rhodanine ring and a radical generator (J.P. KOKAI No. Hei 2-179643, J.P. KOKAI No. Hei 2-244050); a system comprising a titanocene and 3-keto-substituted coumarin compound (J.P. KOKAI No. Sho 63-221110); a system comprising titanocene, xanthene dye, and an addition polymerizable compound having an ethylenically unsaturated bond and an amino group or a urethane group (J.P. KOKAI No. Hei 4-221958, J.P. KOKAI No. Hei 4-219756); a system comprising a titanocene and a specific merocyanine dye (J.P. KOKAI No. Hei 6-295061); and a system comprising a titanocene and a dye having a benzopyran ring (J.P. KOKAI No. Hei 8-334897).

In addition, a laser having a wavelength ranging from 400 nm to 410 nm (violet laser) has been developed and also, a photoinitiation system highly sensitive to the wavelength of 450 nm or shorter has been developed. Therefore, such a photoinitiation system also can be utilized. Examples thereof include a system comprising a cationic dye/borate (J.P. KOKAI No. Hei 11-84647), a system comprising a merocyanine dye/titanocene (J.P. KOKAI No. 2000-147763), a system comprising a carbazole dye/titanocene (Japanese Patent Application No. Hei 11-221480) and the like. In particular, a system comprising a titanocene compound is preferably used in the present invention in view of its high sensitivity.

In the present invention, any titanocene compound can be utilized, but a suitable titanocene compound can be selected from various titanocene compounds including, for example, those described in J.P. KOKAI No. Sho 59-152396 and J.P. KOKAI No. Sho 61-151197. More specifically, examples of the titanocene compound include di-cyclopentadienyl-Ti-di-chloride, di-cyclopentadienyl-Ti-bis-phenyl, di-cyclopentadienyl-Ti-bis-2,3,4,5,6-pentafluorophen-1-yl, di-cyclopentadienyl-Ti-bis-2,3,5,6-tetrafluorophen-1-yl, di-cyclopentadienyl-Ti-bis-2,4,6-trifluorophen-1-yl, di-cyclopentadienyl-Ti-bis-2,6-di-fluorophen-1-yl, di-cyclopentadienyl-Ti-bis-2,4-di-fluorophen-1-yl, di-methylcyclopentadienyl-Ti-bis-2,3,4,5,6- tetrafluorophen-1-yl, di-methylcyclopentadienyl-Ti-bis-2,6-difluorophen-1-yl, di-cyclopentadienyl-Ti-bis-2,6'-difluoro-3-(pyr-1-yl)-phen-1-yl and the like.

Preferred dyes to be used with the titanocene compound include cyanine dyes, merocyanine dyes, xanthene dyes, ketocoumarin dyes, and benzopyran dyes. A preferred cyanine dye is represented by the following formula, but not limited thereto.

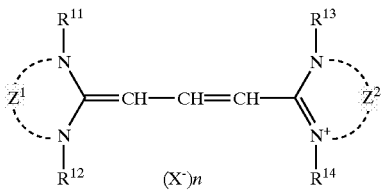

wherein $Z^1$ and $Z^2$ are the same or different and represent a nonmetallic atom necessary to form a benzimidazole or naphthoimidazole ring; $R^{11}$, $R^{12}$, $R^{13}$ and $R^{14}$ each represents an optionally substituted alkyl group; X represents a counter anion and "n" represents 0 or 1.

Specific embodiments of cyanine dyes are shown in Table 1.

TABLE 1

| $R^{11}$ | $R^{12}$ | $R^{13}$ | $R^{14}$ | $A^1$ | $A^2$ | $A^3$ | $A^4$ | $X^-$ | n |
|---|---|---|---|---|---|---|---|---|---|
| $C_2H_5$ | $C_2H_5$ | $C_2H_5$ | $C_2H_5$ | Cl | Cl | Cl | Cl | $I^-$ | 1 |
| $C_2H_5$ | $C_2H_5$ | $C_2H_5$ | $C_2H_5$ | H | $CF_3$ | H | $CF_3$ | $I^-$ | 1 |
| $C_2H_5$ | $(CH_2)_2SO_3Na$ | $C_2H_5$ | $(CH_2)_2SO_3^-$ | Cl | Cl | Cl | Cl | — | 0 |

Preferred examples of merocyanine dyes are shown below, but not limited thereto.

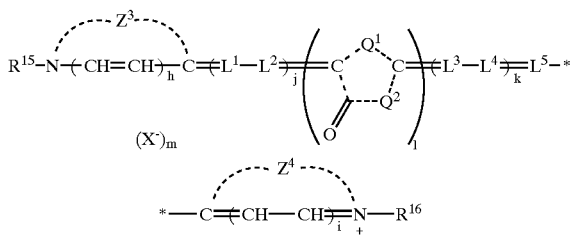

In the above formula, $Z^3$ and $Z^4$ each represents a non-metallic atomic group necessary for forming a 5-membered and/or 6-membered nitrogen-containing heterocyclic ring that is typically contained in cyanine dyes. $R^{15}$ and $R^{16}$ each represents an alkyl group. $Q^1$ and $Q^2$ are atomic groups necessary for forming 4-thiazolinone ring, 5-thiazolinone ring, 4-imidazolidinone ring, 4-oxazolidinone ring, 5-oxazolidinone ring, 5-imidazolidinone ring or 4'-dithiolanone ring. $L^1$, $L^2$, $L^3$, $L^4$ and $L^5$ each represents methine group. "m" represents 1 or 2. "i" and "h" each represents 0 or 1. "l" represents 1 or 2. "j" and "k" each represents 0, 1, 2 or 3. $X^-$ represents a counter anion.

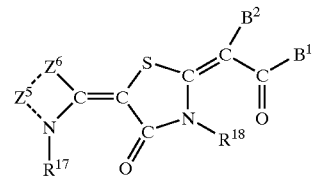

In the above formula, $R^{17}$ and $R^{18}$ each independently represents a hydrogen atom, alkyl group, substituted alkyl group, alkenyl group, substituted alkenyl group, alkynyl group, substituted alkynyl group, alkoxycarobonyl group, aryl group, substituted aryl group or aralkyl group. $Z^6$ represents an oxygen atom, sulfur atom, selenium atom, tellurium atom, alkyl or aryl-substituted nitrogen atom, or dialkyl-substituted carbon atom. $Z^5$ represents non-metallic atoms necessary to form a heterocyclic 5-membered ring containing a nitrogen atom. $B^1$ represents a substituted phenyl group, unsubstituted or substituted polynuclear aromatic ring, or unsubstituted or substituted heteroaromatic ring. $B^2$ represents a hydrogen atom, alkyl group, substituted alkyl group, aryl group, substituted aryl group, aralkyl group, alkoxyl group, alkylthio group, arylthio group, substituted amino group, acyl group, or alkoxycarbonyl group, or $B^2$ and $B^1$ may be linked together to form a ring.

Examples of merocyanine dyes are shown below.

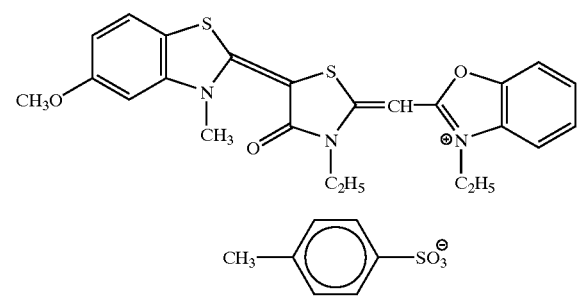

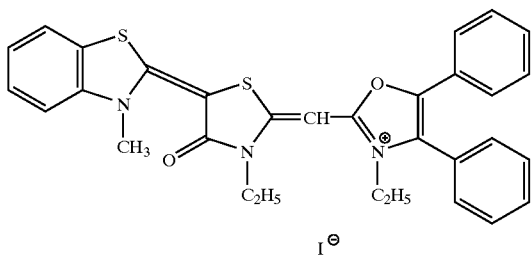

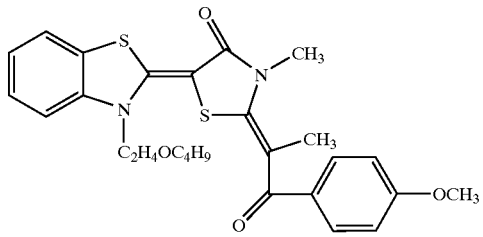

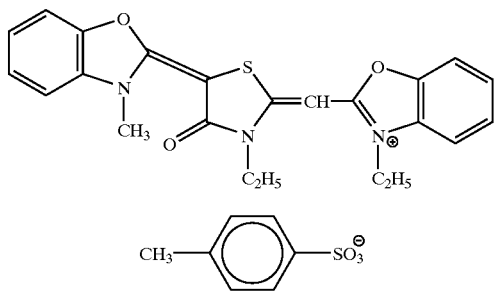

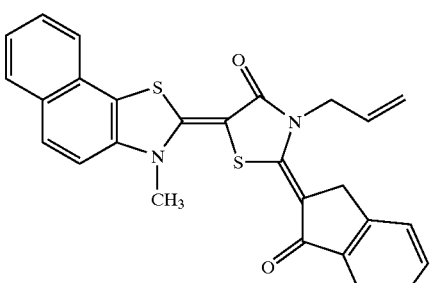

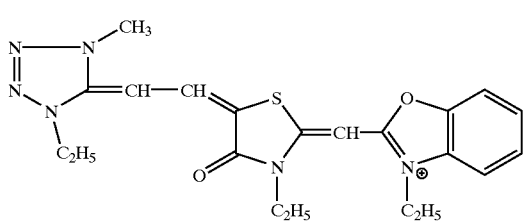

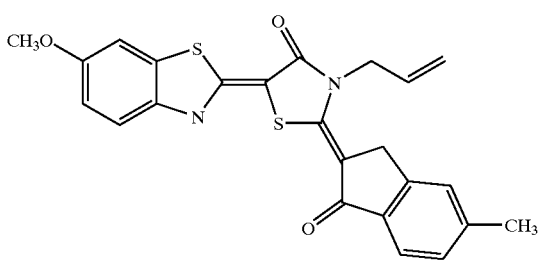

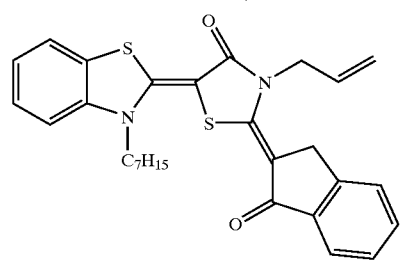

Examples of xanthene dyes include rhodamine B, rhodamine 6G, ethyleosin, alcohol-soluble eosin, pyronine Y, pyronine B and the like.

Preferred examples of ketocoumarin dyes are shown below, but not limited thereto.

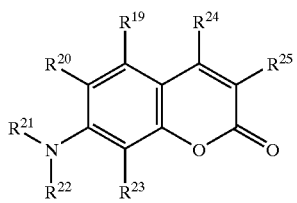

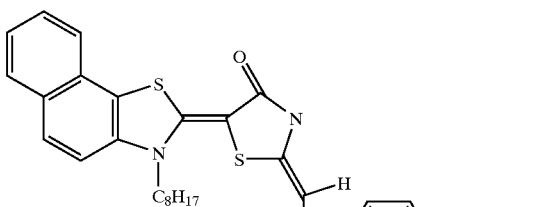

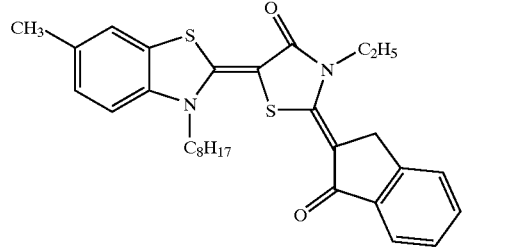

In the above formula, $R^{19}$, $R^{20}$ and $R^{21}$ each independently represents a hydrogen atom, halogen atom, alkyl group or alkoxyl group, $R^{21}$ and $R^{23}$ each represents alkyl group, provided that at least one group represents alkyl group having 4 to 16 carbon atoms, $R^{24}$ represents a hydrogen atom, alkyl group, alkoxyl group, acyl group, cyano group, carboxyl group or ester or amide derivative thereof, $R^{25}$ represents a residue of the heteroaromatic ring, having 3 to 17 total carbon atoms and is represented by —CO—$R^{26}$, $R^{20}$ and $R^{21}$ and/or $R^{22}$ and $R^{23}$ may be bonded together to form a ring, and $R^{26}$ represents the following groups.

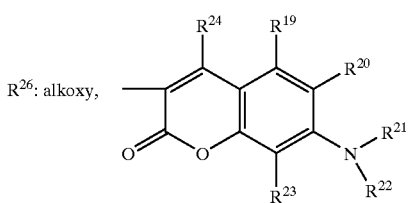

Examples of ketocoumarin dyes are shown below.

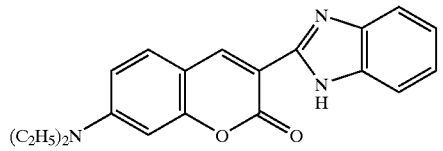

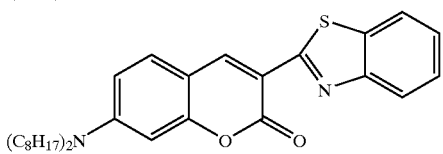

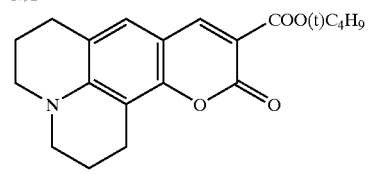

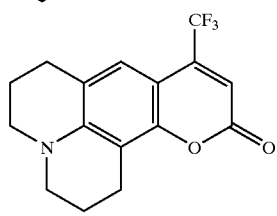

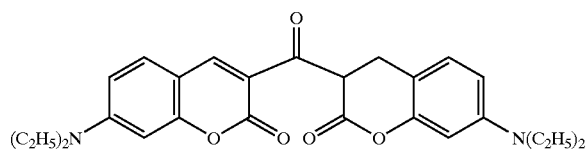

Preferred examples of benzopyran dyes include the compounds represented by the following formula, but are not limited thereto.

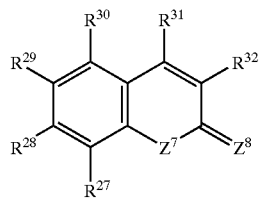

In the above formula, $R^{27}$, $R^{28}$ and $R^{29}$ are independently chosen from a hydrogen atom, halogen atom, alkyl group, aryl group, hydroxyl group, alkoxyl group and amino group. Also, $R^{27}$, $R^{28}$ and $R^{29}$ may form a ring consisting of non-metallic atoms together with the carbon atoms bonded thereto. $R^{31}$ represents a hydrogen atom, alkyl group, aryl group, heteroaromatic group, cyano group, alkoxyl group, carboxyl group or alkenyl group. $R^{29}$ represents a group of $R^{31}$, or $-Z^9-R^3$, wherein $Z^9$ represents a carbonyl group, sulfonyl group, sulfinyl group or arylene dicarbonyl group. Alternatively, $R^{31}$ and $R^{32}$ together may form a ring consisting of non-metallic atoms. $Z^7$ represents O, S, NH or nitrogen atom comprising a substituent thereon.

$Z^8$ represents the following group:

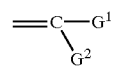

wherein $G^1$ and $G^2$ may be the same or different and represent a hydrogen atom, cyano group, alkoxycarobonyl group, aryloxycarbonyl group, acyl group, arylcarbonyl group, alkylthio group, arylthio group, alkylsulfonyl group, arylsulfonyl group or fluorosulfonyl group, but $G^1$ and $G^2$ do not represent hydrogen atom simultaneously. In addition, $G^1$ and $G^2$ may form a ring consisting of non-metallic atoms together with a carbon atom.

Examples of benzopyran dyes are shown below.

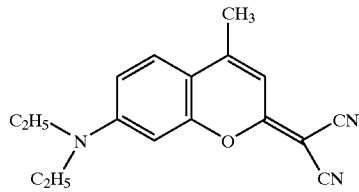

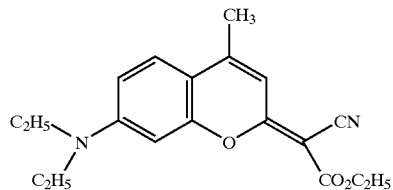

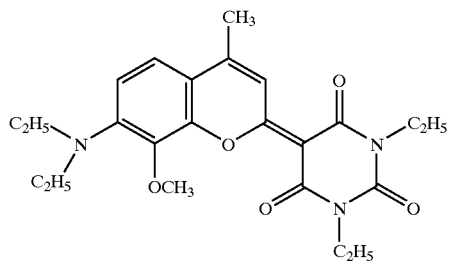

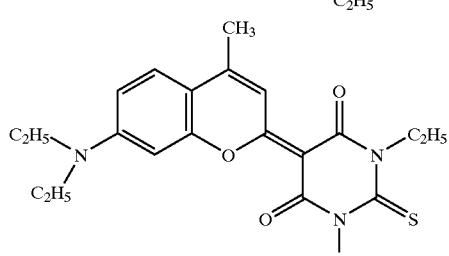

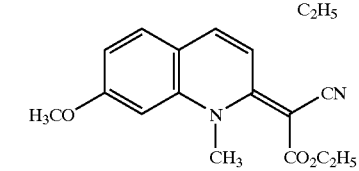

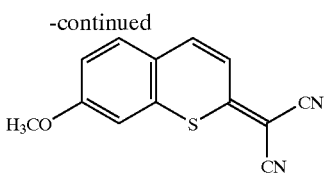

Moreover, it is known that a photoinitiation activity of the above described photopolymerization initiator can be improved by optionally adding to the initiator a hydrogen-donating compound such as thiol compounds, e.g., 2-mercaptobenzthiazole, 2-mercaptobenzimidazole, and 2-mercaptobenzoxazole, and amine compounds, e.g., N-phenylglycine, N,N-dialkylaminoarylcarboxylic acid alkyl ester.

The amount of the photopolymerization initiator (or system) to be used ranges from 0.05 to 100 parts by weight, preferably from 0.1 to 70 parts by weight, and more preferably from 0.2 to 50 parts by weight, per 100 parts by weight of ethylenically unsaturated bond-containing compound.

The binder polymer used in the photosensitive layer of the PS plate of the present invention should be a film-forming material as well as an alkali developer-soluble material. Therefore, an organic polymer compound that is soluble or swellable in an alkali water may be used. Thus, if a water-soluble organic polymer is used, a photopolymerizable composition can be developed with water. Examples of such an organic polymer compound that is soluble or swellable in an alkali water include addition polymers having carboxyl groups on the side chains such as methacrylic acid copolymers, acrylic acid copolymers, itaconic acid copolymers, crotonic acid copolymers, maleic acid copolymers, and partially esterified maleic acid copolymers as disclosed in J.P.KOKAI Nos. Sho 59-44615, 54-92723, 59-53836 and 59-71048, and J.P.KOKOKU Nos. 54-34327, 58-12577 and 54-25957.

Also, an acidic cellulose derivative having a carboxyl group on the side chain can be utilized in the binder polymer of the present invention. In addition, a polymer that is formed by adding a cyclic acid anhydride to an addition polymer having a hydroxyl group can be used. Among these compounds, [benzyl (meth) acrylate/(meth) acrylic acid/ other optional addition-polymerizable vinyl monomer] copolymers and [allyl (meth)acrylate/(meth)acrylic acid/ other optional addition-polymerizable vinyl monomer] copolymers are preferred. In addition, polyvinyl pyrrolidone and polyethylene oxide are useful as a water-soluble organic polymer. Alcohol-soluble polyamides and polyethers such as a reaction product of 2,2-bis-(4-hydroxyphenyl)-propane with epichlorohydrin are also useful for the improvement of the strength of the cured film. In addition, polyurethane resins described in J.P. KOKOKU Nos. Hei 7-120040, Hei 7-120041, Hei 7-120042, Hei 8-12424, J.P. KOKAI Nos. Sho 63-287944, Sho 63-287947, Hei 1-271741, and Hei 11-352691 are also useful in the present invention.

The strength of the cured film can be increased by introducing a radical reactive group into the side chain of the above-described organic polymer compound.

Examples of the addition polymerizable group include ethylenically unsaturated group, amino group, epoxy group and the like. Examples of a functional group which becomes a free radical upon exposure to light include mercapto group, thiol group, halogen atom, triazine structure, onium salt structure and the like. In addition, examples of a polar group that may be present in the binder polymer compound include carboxyl group, imide group and the like. In particular, ethylenically unsaturated groups such as acrylic group, methacrylic group, allyl group, and styryl group are preferred as an addition polymerizable functional group. Also, a functional group selected from the group consisting of amino group, hydroxyl group, phosphonic acid group, phosphoric acid group, carbamoyl group, isocyanate group, ureide group, ureylene group, sulfonic acid group, and ammonio group can be utilized.

In order to maintain the development performance of the composition, the binder polymer compound used in the present invention preferably has a suitable molecular weight and a suitable acid number. That is, a polymer compound having a weight average molecular weight ranging from 5,000 to 300,000 and having an acid number ranging from 20 to 200 may be effectively utilized. These organic polymer compounds can be utilized in the photopolymerizable composition in any suitable amount. However, if the amount thereof exceeds 90% by weight, undesirable problems would be caused. For instance, the formed image may have an insufficient strength. The amount thereof is preferably from 10% to 90% by weight and more preferably from 30% to 80% by weight. The weight ratio of the photopolymerizable ethylenically unsaturated compound to the organic polymer compound is preferably from 1/9 to 9/1, more preferably from 2/8 to 8/2 and 7/3 and further preferably from 3/7 to 7/3.

Moreover, the photosensitive layer usable in the present invention may preferably comprise a small amount of a heat polymerization inhibitor, in addition to the principal components described above, to inhibit unnecessary heat polymerization of the polymerizable ethylenically unsaturated bond-containing compound during the preparation of the photosensitive composition or storage thereof. Specific examples of the heat polymerization inhibitor effectively used are hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), N-nitrosophenylhydroxylamine cerium salt, and N-nitrosophenylhydroxylamine aluminum salt.

The amount of the heat polymerization inhibitor based on the total weight of the photosensitive composition is preferably from about 0.01% to about 5% by weight. Also, if necessary, a higher fatty acid derivative such as behenic acid and behenic acid amide may be added to the photosensitive composition to inhibit the blocking of polymerization by oxygen. The higher fatty acid derivative may be distributed on the surface of the photosensitive layer during the drying process after the application process. The amount of the higher fatty acid derivative is preferably in the range of about 0.5% to about 10% by weight based on the total weight of the photosensitive composition.

In addition, a coloring agent may be added to the photosensitive layer to color the layer. Examples of the coloring agent include phthalocyanine pigments (C. I. Pigment Blue 15:3, 15:4, 15:6 and the like), azo pigments, carbon black, titanium oxide pigments, ethyl violet, crystal violet, azo dyes, anthraquinone dyes, and cyanine dyes. The amount of the dyes or pigments preferably ranges from about 0.5% to about 20% by weight on the basis of the total weight of the photosensitive composition. Additionally, in order to improve the property of the formed film, an additive such as an inorganic filler and plasticizer, e.g., dioctyl phthalate, dimethyl phthalate and tricresyl phosphate, can be added. The amount of the additive is preferably 10% by weight or less based on the total weight of the photosensitive composition.

The photosensitive composition used for the PS plate of the present invention may be dissolved in a variety of organic solvents when the composition is applied onto the foregoing intermediate layer. Examples of the organic solvents include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetylacetone, cyclohexanone, diacetonealcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxyethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate-3-methoxypropyl acetate, N,N-dimethylformamide, dimethylsulfoxide, γ-butyrolactone, methyl lactate, ethyl lactate and the like. The solvent can be used alone or in a combination. A suitable concentration of the solid in the coating solution ranges from 1% to 50% by weight.

The photopolymerizable composition used for the photosensitive layer of the PS plate of the present invention may further comprise a surfactant to improve the property of the coated surface. The amount the surfactant in the photosensitive layer suitably ranges from about 0.1 g/m$^2$ to about 10 g/m$^2$, preferably from 0.3 g/m$^2$ to 5 g/m$^2$, and more preferably from 0.5 g/m$^2$ to 3 g/m$^2$, based on the dried weight of the photosensitive layer.

A protective layer having an oxygen-barrier property can be optionally applied onto the layer of the photopolymerizable composition on a substrate for eliminating the polymerization-inhibitory effect of oxygen in the air. Examples of a water-soluble vinyl polymer comprised in such a protective layer having an oxygen-barrier property include polyvinyl alcohol, partial ester, ether, or acetal thereof and a copolymer thereof comprising a substantial amount of unsubstituted vinyl alcohol unit that makes the compounds water-soluble. Examples of the polyvinyl alcohol include those having a degree of saponification of 71% to 100% and a degree of polymerization of 300 to 2400. Specific examples thereof include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-220, PVA-224, PVA-217EE, PVA-217E, PVA-220E, PVA-224E, PVA-405, PVA-420, PVA-613, L-8 (available from Kuraray Co. Ltd.) and the like. Examples of the copolymer include a copolymer of polyvinyl acetate, polyvinyl chloroacetate, polyvinyl propionate, polyvinyl formal or polyvinyl acetal and copolymers thereof, which are saponified to a degree of 88% to 100%. In addition, examples of the other useful polymers for the protective layer include polyvinylpyrrolidone, gelatin, and gum arabic. The polymers can be used alone or in a combination.

A solvent to be used for coating the protective layer having an oxygen-barrier property is preferably pure water. But, a blend of pure water and alcohols such as methanol and ethanol and/or ketones such as acetone and methyl ethyl ketone may be utilized. The amount of the solid in the coating solution suitably ranges from 1% to 20% by weight.

In addition, the protective layer having an oxygen-barrier property may comprise known additives such as a surfactant to improve an application property of the layer and a plasticizer to improve a film property. As an aqueous plasticizer, for example, propionamide, cyclohexanediol, glycerin, sorbitol and the like may be added. Also, aqueous (meth)acrylic polymers can be added. The amount of the additives after being dried suitably ranges from about 0.1 g/m$^2$ to about 15 g/m$^2$, and preferably from about 1.0 g/m$^2$ to about 5.0 g/m$^2$.

(Aluminum Substrate)

The aluminum substrate usable in the present invention will be described. The aluminum substrate usable in the present invention desirably consists of an aluminum having a high dimensional stability, an alloy thereof with silicon, copper, manganese, magnesium, chromium, zinc, lead, bismuth or nickel, or a plastic film or a paper which is laminated or deposited with an aluminum or aluminum alloy Generally, the thickness of the substrate ranges from about 0.05 mm to about 1 mm. Besides, a composite sheet as disclosed in J.P. KOKAI No. Sho 48-18327 is also preferably used in the present invention.

The aluminum substrate used in the present invention preferably has the surface roughness ranging from 0.2 to 0.55 μm. In order to obtain the roughness of the surface in such a range, the substrate is surface-treated as described hereinafter.

In the present specification, the term "surface roughness" or "roughness of the surface" of the aluminum substrate means centerline average roughness (arithmetic mean roughness) (Ra) determined at right angles with the aluminum rolling direction. Ra is defined by the following formula and expressed in μm.

$$Ra = \frac{1}{L}\int_0^L |f(X)| dX$$

In the formula, L is a measured length in the direction of centerline of roughness curve which is obtained using a probe (feeler), and the roughness curve is expressed as Y=f(X), wherein X is an axis of centerline and Y is an axis in the direction rectangular to X axis. The determination of L and the average roughness is conducted as described in JIS B 0601.

(Surface Graining)

Preferred surface graining methods of aluminum plates include mechanical surface graining, chemical etching, and electrolytic graining as disclosed in J.P. KOKAI No. Sho 56-28893. The surface graining methods further include, for instance, an electrochemical graining in an electrolyte such as hydrochloric acid or nitric acid, and a mechanical graining such as a wire brush graining wherein an aluminum surface is scrabbled with a metal wire, a ball graining wherein an aluminum surface is grained with an abrasive ball and abrasive, a brush graining wherein an aluminum surface is grained with a nylon brush and abrasive. Moreover, these methods can be used alone or in a combination. Among them, a suitable surface graining method used in the present invention is the electrochemical method wherein the surface is grained chemically in an electrolyte such as hydrochloric acid or nitric acid with an electric current density ranging from 100 C/dm$^2$ to 400 C/dm$^2$. More specifically, electrolysis is preferably conducted in 0.1% to 50% of hydrochloric acid or nitric acid at 20° C. to 100° C. for 1 second to 30 minutes with an electric current density ranging from 100 C/dm$^2$ to 400 C/dm$^2$.

The thus grained aluminum substrate may be further chemically etched with an acid or an alkali. It is not industrially advantageous to use an acid as an etching agent since it takes a long time to destroy the micro structure of the plate, but use of an alkali as the etching agent solves this problem.

Suitable alkali agents usable in the present invention include sodium hydroxide, sodium carbonate, sodium aluminate, sodium metasilicate, sodium phosphate, potassium hydroxide and lithium hydroxide. A preferable concentration of the alkali agent ranges from 1% to 50% and a preferable temperature for the treatment with the alkali agent ranges from 20 to 100° C. In addition, a preferred condition for the treatment can be selected so that an amount of the dissolved aluminum becomes in the range of 5 g/m$^3$ to 20 g/m$^3$.

In order to remove a smut remained on the etched surface of an aluminum plate, the plate may be washed with an acid. Examples of the acid to be used include nitric acid, sulfuric acid, phosphoric acid, chromic acid, hydrofluoric acid and fluoboric acid. In particular, preferred smut-removing methods after electrochemical surface graining include a method to contact the plate with 15% to 65% by weight of sulfuric acid solution at 50 to 90° C. as disclosed in J.P. KOKAI No. Sho 53-12739, and a method of alkali etching as disclosed in J.P. KOKOKU No. Sho 48-28123.

(Anodization)

The thus treated aluminum substrate is preferably further subjected to an anodization treatment. The anodization can be conducted by any conventional method known in the art. More specifically, an anodized layer can be formed on the surface of an aluminum substrate by passing a direct or alternating current therethrough in an aqueous solution or non-aqueous solution (i.e., in an electrolyte) comprising sulfuric acid, phosphoric acid, chromic acid, oxalic acid, sulfamic acid, benzenesulfonic acid or a combination thereof.

The conditions for the anodization can be variously changed depending on the kind of the electrolyte used. But, in general, the anodization is preferably performed in an electrolyte having a concentration ranging from 1% to 80% by weight, at a temperature ranging from 5 to 70° C., with a current density ranging from 0.5 A/dm$^2$ to 60 A/dM2 and a voltage ranging from 1 V to 100 V for 10 seconds to 100 seconds.

Among the anodization treatments, particularly a method to anodize in sulfuric acid using a high current density described in U.K. Patent No. 1,412,768, and a method to anodize using phosphoric acid as an electrolyte described in U.S. Pat. No. 3,511,661 are preferred.

The amount of the anodized layer is preferably in the range of 1 g/m$^2$ to 10 g/m$^2$. If it is less than 1 g/m$^2$, the resulting lithographic printing plate has insufficient printing durability and the non-image portion thereof is easily damaged. If it is higher than 10 g/m$^2$, it requires a large amount of electricity to produce the plate to result in an economical disadvantage. More preferable amount ranges from 1.5 g/m$^2$ to 7 g/m$^2$ and most preferably from 2 g/m$^2$ to 5 g/m$^2$.

Moreover, the aluminum plate may be subjected to a sealing treatment after the surface-graining and anodization treatments. Such a sealing treatment is performed by immersing the aluminum plate in a hot water or a hot aqueous solution containing an inorganic or organic salt or by treating the plate in a steam bath. In addition, the aluminum plate may be further subjected to other treatments such as a surface treatment with an alkali metal silicate and a dipping treatment to dip the substrate into an aqueous solution comprising a potassium fluorozirconate or a phosphonic acid salt.

The PS plate of the present invention can be prepared by forming the intermediate layer and the photosensitive layer described above on the thus surface-treated aluminum substrate in this order.

Hereinafter, the method for making a lithographic printing plate of the present invention will be specifically described. The PS plate described above is imagewise exposed to light and then, developed with a developer comprising an inorganic alkali salt and a nonionic surfactant comprising a polyoxyalkylene ether group and having pH of 11.0 to 12.7 and preferably of 11.5 to 12.5. The novel developer utilized in the present invention will be described below.

(Developer)

The developer used in the method for making a lithographic printing plate of the present invention comprises at least one inorganic alkali salt and at least one nonionic surfactant having polyoxyalkylene ether group. In addition, the developer has a pH ranging from 11.0 to 12.7.

Examples of the inorganic alkali salt include any alkali agent, preferably those having the above-described property. Specific examples thereof include inorganic alkali agents such as sodium hydroxide, potassium hydroxide, ammonium hydroxide, lithium hydroxide, sodium silicate, potassium silicate, ammonium silicate, lithium silicate, trisodium phosphate, tripotassium phosphate, triammonium phosphate, sodium carbonate, potassium carbonate, ammonium carbonate, sodium bicarbonate, potassium bicarbonate, ammonium bicarbonate, sodium borate, potassium borate, and ammonium borate. The alkali agent can be alone or in a combination.

When a silicate is used, the development performance of the developer can be easily controlled by changing the mixing ratio of silicon dioxide $SiO_2$ and alkali metal oxide $M_2O$ wherein M is alkali metal or ammonium group and by changing the concentration thereof The molar ratio of said silicate $SiO_2$ to alkali metal oxide $M_2O$ ($SiO_2/M_2O$) in the aqueous alkali solution is 0.5 to 3.0 and preferably, 1.0 to 2.0. If the ratio $SiO_2/M_2O$ is below 0.5, sometimes it causes a problem that an aluminum substrate is etched by the developer since the alkali strength becomes too strong. In contrast, if the ratio is beyond 3.0, the development performance would be deteriorated.

The content of the alkali silicate in the aqueous alkali solution is preferably 1% to 10% by weight, more preferably 3% to 8% by weight and most preferably 4% to 7% by weight. If the content is less than 1% by weight, the development performance and processing performance may be deteriorated. If the content is more than 10% by weight, precipitation or crystalline material would be easily produced in the developer and moreover, the developer easily gelates when it is neutralized, which may cause problem in the treatment of the wastewater.

Also, an organic alkali agent may be used as a secondary agent to aid a minute control of alkali concentration and an improvement of solubility of the photosensitive layer. Examples of the organic alkaline agent include monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine, tetramethylammonium hydroxide and the like. The alkaline agent can be used alone or in a combination.

The developer utilized in the method of the present invention comprises a nonionic surfactant comprising a polyoxyalkylene ether group. The nonionic surfactant in the developer improves the solubility of a non-irradiated portion of the photosensitive layer of the present invention and decreases the permeability of the developer into an irradiated portion of the photosensitive layer. The following compound represented by the general formula (I) can be suitably utilized as the surfactant comprising a polyoxyalkylene ether group.

$$R^{40}-O-(R^{41}-O)_pH \qquad (I)$$

In the formula (I), $R^{40}$ represents an optionally substituted alkyl group having 3 to 15 carbon atoms, optionally substituted aromatic hydrocarbon group having 6 to 15 carbon atoms, or optionally substituted heteroaromatic ring having 4 to 15 carbon atoms, wherein the substituent on these groups is an alkyl group having 1 to 20 carbon atoms, halogen atom such as Br, Cl, I, etc., aromatic hydrocarbon group having 6 to 15 carbon atoms, aralkyl group having 7 to 17 carbon atoms, alkoxyl group having 1 to 20 carbon atoms, alkoxy-carbonyl group having 2 to 20 carbon atoms, or acyl group having 2 to 15 carbon atoms, $R^{41}$ represents an optionally substituted alkylene group having 1 to 100 carbon atoms, wherein the substituent on the group is an alkyl group having 1 to 20 carbon atoms or aromatic hydrocarbon group having 6 to 15 carbon atoms, and "p" represents an integer of 1 to 100.

In the formula (I), specific examples of "aromatic hydrocarbon group" include phenyl group, tolyl group, naphthyl group, anthryl group, biphenyl group, and phenanthryl group; specific examples of "heteroaromatic ring" include furyl group, thionyl group, oxazolyl group, imidazolyl group, pyranyl group, pyridinyl, acridinyl group, benzofuranyl group, benzothionyl group, benzopyranyl group, benzoxazolyl group, and benzimidazolyl group.

In addition, if "p" is an integer of 2 to 100, $R^{41}$ may be the same or different. Specific examples of such a group include a combination of ethyleneoxy group and propyleneoxy group, a combination of ethyleneoxy group and isopropyloxy group, a combination of ethyleneoxy group and butyleneoxy group, and a combination of ethyleneoxy group and isobutylene group, in which each group may be connected to each other in a random or block manner. In the present invention, the nonionic surfactant comprising a polyoxyalkylene ether group may be used alone or in a combination. An effective amount of the surfactant to be used in a developer is in the range of 1% to 30% by weight and preferably from 2% to 20% by weight. If the amount of the surfactant is too small, the development performance of the developer would be deteriorated. If the amount of the surfactant is in excess, the printing durability would be deteriorated.

Examples of the nonionic surfactant comprising a polyoxyalkylene ether group represented by the above general formula (I) include polyoxyethylene alkyl ethers such as polyoxyethylene lauryl ether, polyoxyethylene cetyl ether, polyoxyethylene stearyl ether and the like, polyoxyethylene aryl ethers such as polyoxyethylene phenyl ether, polyoxyethylene naphthyl ether and the like, polyoxyethylene alkylaryl ethers such as polyoxyethylene methylphenyl ether, polyoxyethylene octylphenyl ether, polyoxyethylene nonylphenyl ether and the like.

Further, the following other surfactants may be added to the developer used in the present invention; nonionic surfactants (e.g., polyoxyethylene alkyl esters such as polyoxyethylene stearate, sorbitan alkyl esters such as sorbitan monolaurate, sorbitan monostearate, sorbitan distearate, sorbitan monooleate, sorbitan sesquioleate, and sorbitan trioleate, and monoglyceride alkyl esters such as glycerol monostearate, and glycerol monooleate); anionic surfactants (e.g., salts of alkylbenzenesulfonic acid such as sodium dodecylbenzenesulfonate, salts of alkylnaphthalenesulfonic acid such as sodium butylnaphthalenesulfonate, sodium pentylnaphthalenesulfonate, sodium hexylnaphthalenesulfonate, and sodium octylnaphthalenesulfonate, alkyl sulfates such as sodium laurylsulfate, salts of alkylsulfonic acid such as sodium dodecylsulfonate, and salts of sulfosuccinic acid ester such as sodium dilaurylsulfosuccinate); and amphoteric surfactants (e.g., alkylbetaine such as laurylbetaine and stearylbetaine, and amino acids), with the anionic surfactants such as alkylnaphthalenesulfonic acid salt being particularly preferred.

These surfactants may be used alone or in a combination. The amount of the surfactant in the developer is suitably in the range of 0.1% to 20% by weight, which the amount is calculated based on the weight of the effective component in the surfactant.

The preferred pH of the developer used in the present invention is in the range of 11.0 to 12.7 and preferably of 11.5 to 12.5. If the pH of the developer is lower than 11.0, it is not possible to form an image. In contrast, if the pH of the developer is higher than 12.7, it causes problems such as an over-development of the plate or a damage of an irradiated portion during the development.

The developer utilized in the present invention preferably has conductivity in the range of 3 mS/cm to 30 mS/cm. If the conductivity of the developer is lower than the range, generally, it is difficult to elute (dissolve) the photosensitive composition on an aluminum substrate to thus result in a contamination in the plate during printing process. If the conductivity is higher than the range, an elution rate of the photosensitive composition becomes so slow to generate remain of a non-irradiated portion of a film due to a high concentration of a salt. In particular, the conductivity is preferably in the range of 5 mS/cm to 20 mS/cm.
(Exposure to Light and Development)

The PS plate of the present invention is imagewise exposed to a conventional active light such as carbon arc lamps, high pressure mercury lamps, xenon lamps, metal halide lamps, fluorescent lamps, tungsten lamps, halogen lamps, helium-cadmium laser, argon ion laser, FD•YAG laser, helium-neon laser and semiconductor rays (350 nm to 600 nm). Then, the plate was developed with a developer to form an image on the surface of the aluminum plate. After being imagewise exposed to light and before being developed, the plate may be heated at 50° C. to 150° C. for 1 second to 5 minutes in order to enhance the degree of polymerization of the photopolymerizable photosensitive layer.

Typically, an overcoat layer having an oxygen barrier property is coated on a photosensitive layer of the PS plate of the present invention as described above. It is known that such an overcoat layer may be removed simultaneously with the remove of the non-irradiated portion of the photosensitive layer with a developer, or may be removed with water or hot water before removing the non-irradiated portion of the photosensitive layer with a developer. Such water or hot water may comprise preservatives as described in J.P. KOKAI No. Hei 10-10754 and organic solvents as described in J.P. KOKAI No. Hei 8-278636.

The development of the PS plate of the present invention with the developer described above may be conducted under the conventional condition, that is, by immersing the imagewise exposed plate in the developer at 0 to 60° C., preferably at 15 to 40° C. and by rubbing the plate with a brush.

In addition, in the case that the development process is conducted using an automatic development machine, the development performance of the developer used therein (capability of the developer to sufficiently develop the plate) may be recovered by adding a replenisher or a fresh developer when the developer becomes exhausted after a large number of plates are treated.

The thus treated plate is then, generally treated with water, a rinse comprising a surfactant, and/or a solution for desensitizing the plate to grease comprising gum arabic, starch derivatives and the like, as described in J.P. KOKAI Nos. Sho 54-8002, Sho 55-115045, and Sho 59-58431. The PS plate of the present invention may be subjected to various combinations of the treatments.

The thus treated plate may be further subjected to a heat treatment such as a burning or to a treatment after an exposure to light as described in J.P. KOKAI No. 2000-89478 to improve the printing durability of the plate.

Thus obtained lithographic printing plate is set on an offset press and then is used for printing.

EXAMPLES

Hereinafter, the present invention will be explained more specifically by Examples, but the present invention is not limited thereto.

Example 1

A 1S aluminum plate having a thickness of 0.30 mm was surface-grained with a No.8 nylon brush and a suspension of 800 mesh pumice stone in water and then sufficiently washed with water. After the plate was etched by immersing in an aqueous solution of 10% sodium hydroxide for 60 seconds at 70° C., the plate was washed with running water. Then the plate was washed with 20% $HNO_3$ to neutralize it and washed with water. Then, an electrolytic graining of the plate was conducted in a 1% aqueous solution of nitric acid using a rectangle alternating continuous wave voltage with an anode electric amount of 300 coulomb/$dm^2$ under the condition of $V_A=12.7V$. The roughness of the surface of the plate determined with an experimental device: Surfcom available from Tokyo Seimitu Co. Ltd., with a needle having a tip diameter of 2 μm, was 0.45 μm (Ra). The plate was then immersed in a 30% $H_2SO_4$ for 2 minutes at 55° C. to desmut the surface. Then, the plate was anodized in a 20% aqueous solution of $H_2SO_4$ at 33° C. by placing a cathode on the grained surface using an electric current density of 5 A/$dm^2$ for 50 seconds to obtain a substrate having an anodized layer of which thickness was 2.7 g/$m^2$.

A solution of a polymer, U-1 (molecular weight Mn=10,000) in water/methanol=5 g/95 g was coated on the treated aluminum plate, and the plate was dried at 80° C. for 30 seconds to form an intermediate layer. The thickness of the intermediate layer was 10 mg/$m^2$. A highly sensitive photopolymerizable composition P-1 described below was coated on the intermediate layer so that the dried weight thereof became 1.5 g/$m^2$, and then the plate was dried at 100° C. for 1 minute to form a photosensitive layer.

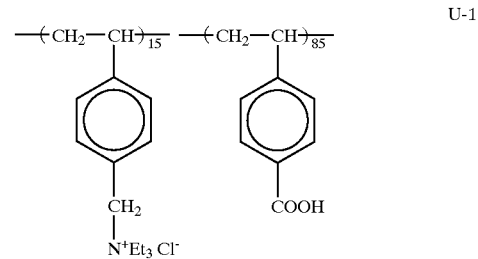

(Photopolymerizable Composition P-1)

| | |
|---|---:|
| Ethylenically unsaturated bond-containing compound (A1) | 1.5 part by weight |
| Linear organic polymer compound (polymer binder) (B1) | 2.0 part by weight |
| Sensitizer (C1) | 0.15 part by weight |

-continued
| | |
|---|---|
| Initiator of photopolymerization (D1) | 0.2 part by weight |
| ε-Phthalocyanine (F1) dispersion | 0.02 part by weight |
| Fluorine atom-containing nonionic surfactant, Megafac F-177 (Dainippon Ink and Chemicals, Inc.) | 0.03 part by weight |
| Methyl ethyl ketone | 9.0 part by weight |
| Propylene glycol monomethyl ether acetate | 7.5 part by weight |
| Toluene | 11.0 part by weight |
A1
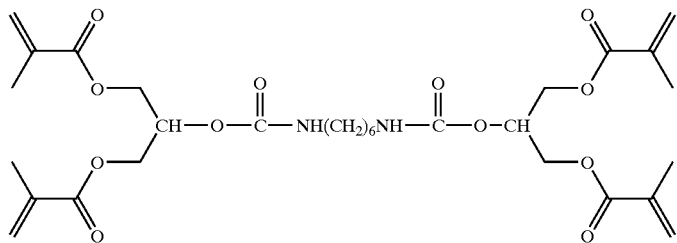
B1
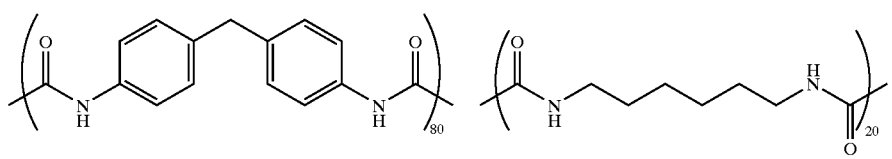
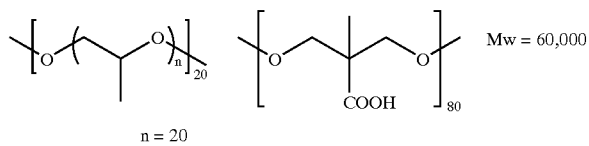
n = 20
C1
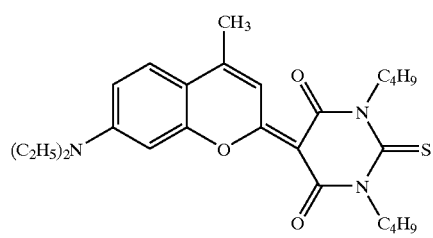
D1
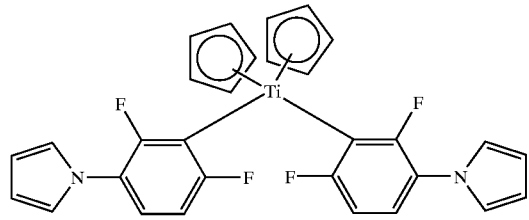
F1
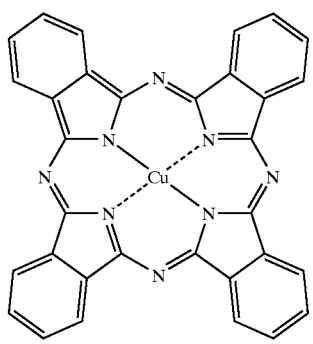

A 3% by weight solution of polyvinyl alcohol (the degree of saponification was 98% by mole and the degree of polymerization was 500) was coated on the photosensitive layer so that the dried weight of the polyvinyl alcohol became 2.5 g/m² and the coating was dried at 120° C. for 3 minutes to obtain a PS plate.

In order to determine the level of contamination of a lithographic printing plate under an aging condition, the PS plate was stored for 5 days at 50° C. in 80% RH, which the condition simulates an aging condition.

The PS plate before and after being stored under the simulative aging condition was exposed to light with 100 µJ/cm² of FD•YAG laser (Plate Jet 4, available from CSI company) by scanning 1% to 99% of dot image (by 1%) and solid image on the plate under a condition of 4000 dpi and 175 lines/inch. Then, the plate was subjected to a standard treatment in an automatic developing machine (LP-850P2, available from Fuji Photo Film Co. Ltd.) comprising Developer 1 and a finishing gum liquid FP-2W (available from Fuji Photo Film Co. Ltd.). Preheating conditions for the plate were as follows; the temperature on the surface of plate was 100° C., the developing temperature was 30° C., and the immersing time in the developer was about 15 seconds.

Developer 1 contains the components described below and has a pH of 11.5 at 25° C. and conductivity of 5 mS/cm.

| (Developer 1) | |
|---|---|
| Potassium hydroxide | 0.15 g |
| Polyoxyethylene phenyl ether (n = 13) | 5.0 g |
| Chelest 400 (chelating agent) | 0.1 g |
| Water | 94.75 g |

Examples 2 to 7

The same procedure as described in Example 1 was repeated except that the copolymer component for the intermediate layer in Table 2 was substituted for the copolymer component for the intermediate layer described in Example 1 to obtain a lithographic printing plate before and after being stored under the aging condition.

TABLE 2

Composition for copolymer used in Intermediate layer (% by mole)

| Example No. | 2 | 3 | 4 | 5 | 6 | 7 |
|---|---|---|---|---|---|---|
| Composition | A | B | C | D | E | F |
| $CH_2{=}CH{-}C_6H_4{-}COOH$ | 90 | 80 | 85 | 80 |  | 85 |
| $CH_2{=}CH{-}C_6H_4{-}CH_2N^+Et_3\,Cl^-$ | 10 | 10 |  |  | 10 | 10 |
| $CH_2{=}CH{-}C_6H_4{-}CH_2N^+Et_3\,Cl^-$ (ortho) |  |  | 10 |  |  |  |
| $CH_2{=}CH{-}C_6H_4{-}CH_2N^+Me_3\,Cl^-$ |  |  |  | 15 |  |  |
| $CH_2{=}CH{-}C_6H_4{-}CH_2{-}S^+(CH_2)_4\ BF_4^-$ |  |  |  |  | 10 |  |
| $CH_2{=}C(CH_3){-}C_6H_4{-}COOH$ |  |  |  |  | 80 |  |
| $CH_2{=}C(CH_3){-}COOCH_2CH_2N^+H(CH_3)_2$ |  |  |  |  | 10 | 5 |

TABLE 2-continued

| Composition for copolymer used in Intermediate layer (% by mole) | | | | | | |
|---|---|---|---|---|---|---|
| Example No. | 2 | 3 | 4 | 5 | 6 | 7 |
| Composition | A | B | C | D | E | F |
| $CH_2{=}\underset{\underset{CH_3}{|}}{C}{-}COONH{-}\underset{\underset{CH_3}{|}}{\overset{\overset{CH_3}{|}}{C}}{-}CH_2SO_3H$ | | | | | 10 | |
| Average molecular weight | 18,000 | 7,000 | 23,000 | 12,000 | 5,000 | 45,000 |

Examples 8 to 10

The same procedure as described in Example 1 was repeated except that the coating amount of the intermediate layer in Example 1 was changed to 5 mg/m², 15 mg/m² or 20 mg/m².

Examples 11 to 15

The same procedure as described in Example 1 was repeated except that the linear organic polymer compound B2 to B6 was substituted for B1 in photopolymerizable composition P-1 described in Example 1 (that is, photopolymerizable composition P-2 to P-6 was used instead of P-1) to obtain lithographic printing plates of Examples 11 to 15.

B2 (P-2): allyl methacrylate/methacrylic acid (70/30% by mole) copolymer, molecular weight: 50,000.

B3 (P-3): methyl methacrylate/isobutyl methacrylate/ methacrylic acid (60/20/20% by mole) copolymer, molecular weight 100,000.

B4 (P-4): methyl methacrylate/isopropylacrylamide/ methacrylic acid (65/15/20% by mole) copolymer, molecular weight 70,000.

B5(P-5):

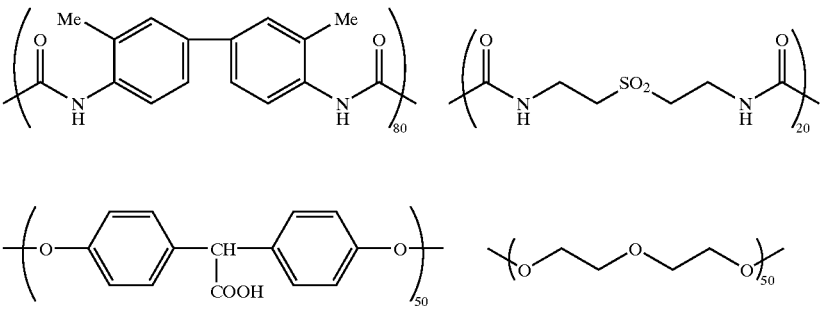

Molecular weight Mw = 40,000

B6(P-6):

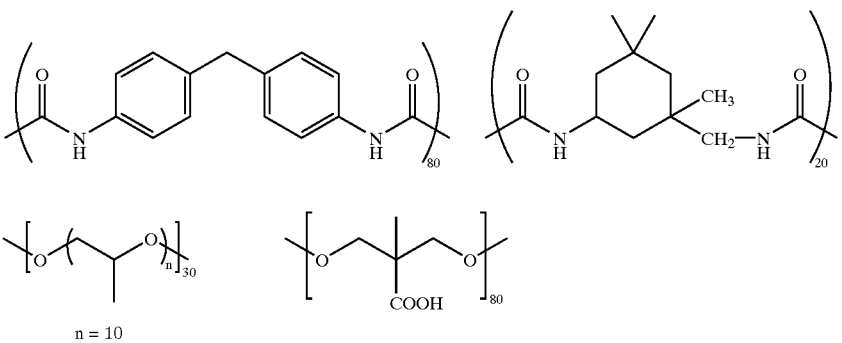

Molecular weight Mw = 120,000

Example 16

The same procedure as described in Example 15 was repeated except that the following compound (A2) was substituted for A1 (that is, ethylenically unsaturated bond-containing compound P-7 was used) to obtain a lithographic printing plate of Example 16.

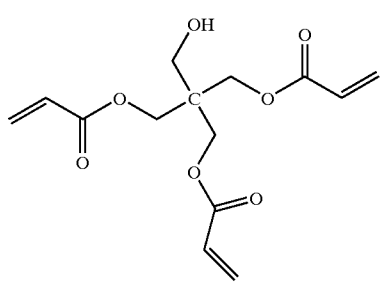

Examples 17 to 20

The same procedure as described in Example 1 was repeated except that Developer 2, 3, 4 or 5 in Table 3 was substituted for Developer 1 in Example 1.

TABLE 3

| | | pH | conductivity |
|---|---|---|---|
| Developer 2 | | | |
| potassium hydroxide | 0.15 g | 11.7 | 6 mS/cm |
| polyoxyethylene naphthyl ether (n = 10) | 5.0 g | | |
| Chelest 400 | 0.1 g | | |
| water | 94.75 g | | |
| Developer 3 | | | |
| potassium hydroxide | 0.15 g | 11.9 | 6 mS/cm |
| polyoxyethylene naphthyl ether (n = 12) | 5.0 g | | |
| triethanolamine | 1.35 g | | |
| Chelest 400 | 0.1 g | | |
| water | 93.4 g | | |
| Developer 4 | | | |
| 1K-potassium silicate | 2.5 g | 12.2 | 20 mS/cm |
| potassium hydroxide | 0.15 g | | |
| polyoxyethylene naphthyl ether (n = 10) | 5.0 g | | |
| Chelest 400 | 0.1 g | | |
| water | 92.25 g | | |
| developer 5 | | | |
| 1K-potassium silicate | 2.5 g | 11.5 | 22 mS/cm |
| potassium hydroxide | 0.08 g | | |
| polyoxyethylene naphthyl ether (n = 12) | 5.0 g | | |
| Anon LG | 1.0 g | | |
| Chelest 400 | 0.1 g | | |
| water | 91.32 g | | |

Example 21

JIS A1050 aluminum plate having a thickness of 0.24 mm was surface-grained with a nylon brush and a suspension of 400 mesh pumice stone in water and then washed well with water. After the plate was etched by immersing in an aqueous solution of 10% sodium hydroxide for 60 seconds at 70° C., the plate was washed with running water. Then the plate was washed with 20% $HNO_3$ to be neutralized and washed with water. Then, an electrolytic graining of the plate was conducted in a 1% aqueous solution of nitric acid using a rectangle alternating continuous wave voltage with an anode electric amount of 260 coulomb/$dm^2$ under the condition of $V_A$=12.7 V. The roughness of the surface of the plate was 0.55 $\mu$m (Ra). The plate was then immersed in a 30% $H_2SO_4$ for 2 minutes at 55° C. to desmut the surface. Then, the plate was anodized in a 20% aqueous solution of $H_2SO_4$ using an electric current density of 14 A/$dm^2$ to obtain a substrate having an anodized layer of which thickness was 2.5 g/$m^2$. The plate was then washed with water to thus give substrate [A].

The thus obtained substrate [A] was treated with an aqueous solution comprising 0.15% by weight of sodium silicate at 22° C. for 10 seconds and was washed with water to give substrate [B]. Substrate [A] was also treated with an aqueous solution comprising 2.5% by weight of sodium silicate at 30° C. for 10 seconds and was washed with water to give substrate [C]. Substrate [A] was also treated with an aqueous solution comprising 2.5% by weight of sodium silicate at 50° C. for 5 seconds and was washed with water to give substrate [D].

An intermediate layer, a photosensitive layer and OC layer were coated on the thus treated aluminum plates by the same method as described in Example 1 to provide the corresponding PS plates. Then the PS plates were further treated as described in Example 1 to provide lithographic printing plates that are before and after being kept in an aging condition.

Comparative Example 1

The same procedure as described in Example 1 was repeated except that the intermediate layer described in Example 1 was not formed, to obtain a lithographic printing plate.

Comparative Example 2

The same procedure as described in Example 1 was repeated except that Developer 6 comprising an amphoteric surfactant and an alkali metal silicate salt ($SiO_2/K_2O$), that is, a solution obtained by diluting LP-D developer available from Fuji Photo Film Co. Ltd. with water, was used in place of Developer 1 described in Example 1, and that the PS plate prepared in the Comparative Example 1 was used in place of the PS plate in Example 1. Developer 6 does not comprise any nonionic surfactant comprising polyoxyalkylene ether group. In addition, pH of Developer 6 was 12.8 and conductivity was 32 mS/cm.

Printing durability and background contamination were evaluated for the lithographic printing plates obtained by the methods described in Examples 1 to 21 and Comparative Examples 1 to 2.

Printing operation with a lithographic printing plate was conducted using $R^{201}$-type printer available from Man-Roland company and GEOS G black (N) ink (available from Dainippon Ink and Chemicals, Inc.) and the number of printings obtained before dots loss on 3% mesh was observed was determined to evaluate the printing durability of the lithographic printing plate.

The background contamination was evaluated by visibly checking the presence of a contamination when the printing operation with a lithographic printing plate was conducted using Daiya IF2 printer available from Mitsubishi Heavy Industries, Ltd., and GEOS G Red (S) available from Dainippon Ink and Chemicals, Inc. The results are shown in Table 4.

TABLE 4

| | Before being stored | | After being stored for 5 days at 50° C. and 80% RH | |
|---|---|---|---|---|
| | Background contamination | Printing durability (number of copies) | Background contamination | Printing durability (number of copies) |
| Example 1 | None | 150,000 | None | 160,000 |
| Example 2 | None | 180,000 | None | 170,000 |
| Example 3 | None | 130,000 | None | 130,000 |
| Example 4 | None | 140,000 | None | 150,000 |
| Example 5 | None | 150,000 | None | 150,000 |
| Example 6 | None | 150,000 | None | 140,000 |
| Example 7 | None | 170,000 | None | 160,000 |
| Example 8 | None | 160,000 | None | 160,000 |
| Example 9 | None | 150,000 | None | 150,000 |
| Example 10 | None | 130,000 | None | 150,000 |
| Example 11 | None | 170,000 | None | 160,000 |
| Example 12 | None | 140,000 | None | 140,000 |
| Example 13 | None | 180,000 | None | 180,000 |
| Example 14 | None | 160,000 | None | 160,000 |
| Example 15 | None | 140,000 | None | 150,000 |
| Example 16 | None | 130,000 | None | 150,000 |
| Example 17 | None | 160,000 | None | 160,000 |
| Example 18 | None | 170,000 | None | 160,000 |
| Example 19 | None | 180,000 | None | 180,000 |
| Example 20 | None | 160,000 | None | 150,000 |
| Example 21 | None | 150,000 | None | 140,000 |
| Comp. Ex. 1 | Slightly contaminated | 30,000 | Severely contaminated | 40,000 |
| Comp. Ex. 2 | Slightly contaminated | 40,000 | Slightly contaminated | 40,000 |

As seen from Table 4, every printing plate of the Examples of the present invention gave good results. In contrast, the printing plate of Comparative Example 1 showed background contamination when the plate was stored at high temperature under high humidity. In addition, the printing durability of the plate of Comparative Example 1 was low both before and after storage. Also, the printing plate of Comparative Example 2 which was developed with a developer comprising nonionic surfactant having polyoxyalkylene ether group showed a background contamination both before and after the storage. In addition, the printing plate of Comparative Example 2 showed low printing durability both before and after storage.

As seen from the above, the method of the present invention provides a lithographic printing plate which shows no background contamination even after storage under a simulative aging condition and high printing durability.

Thus, the method for preparing a lithographic printing plate which comprises imagewise exposing to light a presensitized plate useful for making a lithographic printing plate having an intermediate layer and a photosensitive layer on an aluminum substrate in this order and developing the imagewise exposed plate with a developer, wherein said intermediate layer comprises a polymer compound having a component with acid group and a component with an onium group and said developer comprises an inorganic alkali salt and a nonionic surfactant having polyoxyalkylene ether group and pH of the developer ranges from 11.0 to 12.7 gives a lithographic printing plate which shows good contrast between an image area and non-image area, no background contamination during printing, good stability with time and good printing durability. In addition, the developer to be used in the method of the present invention has a relatively low pH and thus, the method of the present invention can be safely utilized and provides an effect to reduce the influence of a waste of the developer on an environment.

What is claimed is:

1. A method for preparing a lithographic printing plate which comprises imagewise exposing to light a presensitized plate useful for making a lithographic printing plate having an intermediate layer and a photopolymerizable photosensitive layer comprising an addition polymerizable or ethylenically unsaturated bond-containing compound, photopolymerization initiator, and polymer binder on an aluminum substrate in this order and developing the imagewise exposed plate with a developer, wherein said intermediate layer comprises a polymer compound comprising at least a structure unit having an acid group and a structure unit having an onium group and said developer comprises an inorganic alkali salt and a nonionic surfactant having the structure represented by the following formula (I)

$$R^{40}-O-(R^{40}-O)_pH \qquad (I)$$

wherein, $R^{40}$ represents an optionally substituted naphthyl group, $R^{41}$ represents an optionally substituted alkylene group having 1 to 100 carbon atoms, and "p" represents an integer of 1 to 100, and said developer has a pH ranging from 11.0 to 12.7.

2. The method of claim 1, wherein the acid group in the structure unit of the polymer compound is selected from the group consisting of $-COOH$, $-SO_3H$, $-OSO_3H$, $-PO_3H_2$, $-OPO_3H_2$, $-CONHSO_2-$, and $-SO_2NHSO_2-$.

3. The method of claim 1, wherein the onium group in the structure unit of the polymer compound comprises an atom selected from atoms of group 5 and group 6 in the periodic table.

4. The method of claim 1, wherein the structure unit having an acid group is derived from the compound represented by the following

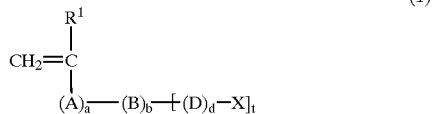

(1)

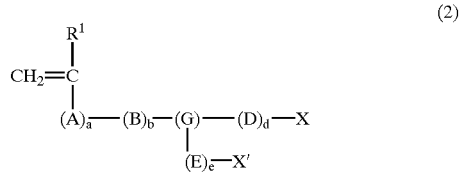

(2)

general formula (1) or (2);

wherein A is a bivalent connecting group; B is a bivalent, trivalent or tetravalent aromatic or substituted aromatic group; D and E each independently represents a bivalent connecting group; G is a trivalent connecting group; X and X' each independently represents an acid group having pKa of 7 or less or an alkali metal salt or ammonium salt thereof; $R^1$ is a hydrogen atom, alkyl group or halogen atom; "a", "b", "d" and "e" each independently represents 0 or 1; and "t" is 1 to 3.

5. The method of claim 4, wherein A is —COO— or —CONH—; B is a phenylene group or substituted phenylene group wherein the substituent is a hydroxy group, halogen atom or alkyl group; D and E each independently represents an alkylene group or a bivalent connecting group represented by the molecular formula of $C_nH_{2n}O$, $C_nH_{2n}S$ or $C_nH_{2n+1}N$; G is a trivalent connecting group represented by the molecular formula of $C_nH_{2n-1}$, $C_nH_{2n-1}O$, $C_nH_{2n-1}S$ or $C_nH_{2n}N$, wherein "n" is 1 to 12; X and X' each independently represents a carboxylic acid, sulfonic acid, phosphonic acid, sulfuric acid mono ester or phosphoric acid mono ester; $R^1$ is a hydrogen atom or alkyl group; "a", "b", "d" and "e" each independently represents 0 or 1, provided that "a" and "b" are not simultaneously 0.

6. The method of claim 5, wherein B is a phenylene group or substituted phenylene group wherein the substituent is a hydrogen group or C1 to C3 alkyl group; D and E each independently represents C1 or C2 alkylene group or C1 or C2 alkylene group which is connected via an oxygen atom; $R^1$ is a hydrogen atom or methyl group; X is a carboxylic acid group; "a" is 0; and "b" is 1.

7. The method of claim 1, wherein the structure unit having an onium group is derived from the compound represented by the following general formula (3), (4) or (5);

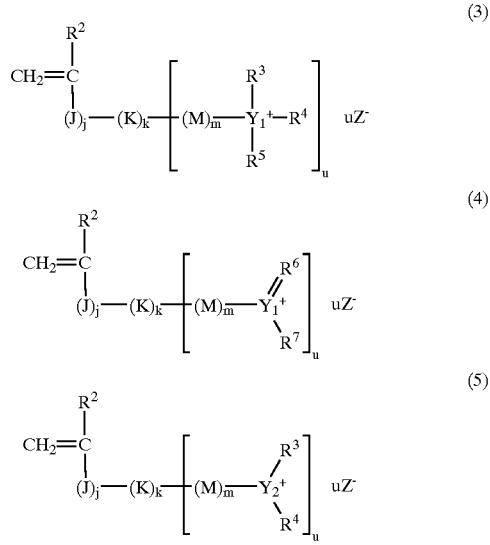

wherein J is a bivalent connecting group; K is a bivalent, trivalent or tetravalent aromatic or a substituted aromatic group; M independently represents a bivalent connecting group; $Y_1$ is an atom of group 5 in the periodic table; $Y_2$ is an atom of group 6 in the periodic table; $Z^-$ is a counter anion; $R^2$ is a hydrogen atom, alkyl group or halogen atom; $R^3$, $R^4$, $R^5$ and $R^7$ each independently represents a hydrogen atom or an optionally substituted alkyl group, aromatic group, or aralkyl group; $R^6$ is an alkylidene group or substituted alkylidene group; $R^3$ and $R^4$, or $R^6$ and $R^7$ may be linked together to form a ring; "j", "k" and "m" each independently represents 0 or 1; and "u" is 1 to 3.

8. The method of claim 7, wherein J is —COO— or —CONH—; K is a phenylene group or a substituted phenylene group wherein the substituent is a hydroxy group, halogen atom or alkyl group; M is an alkylene group or a bivalent connecting group having the molecular formula of $C_nH_{2n}O$, $C_nH_{2n}S$ or $C_nH_{2n+1}N$, wherein "n" is 1 to 12; $Y_1$ is a nitrogen atom or phosphorus atom; $Y_2$ is a sulfur atom; $Z^-$ is a halogen ion, $PF_6^-$, $BF_4^-$ or $R^8SO_3^-$; $R^2$ is a hydrogen atom or alkyl group; $R^3$, $R^4$, $R^5$ and $R^7$ each independently represents a hydrogen atom or optionally substituted C1 to C10 alkyl group, aromatic group, or aralkyl group; $R^6$ is a C1 to C10 alkylidene group or substituted alkylidene group; $R^3$ and $R^4$, or $R^6$ and $R^7$ may be linked together to form a ring; "j", "k" and "m" each independently represents 0 or 1 provided that "j" and "k" are not simultaneously 0; and $R^8$ is an optionally substituted C1 to C10 alkyl group, aromatic group, or aralkyl group.

9. The method of claim 8, wherein K is a phenylene group or substituted phenylene group wherein the substituent is a hydroxy group or C1 to C3 alkyl group; M is C1 or C2 alkylene group or C1 or C2 alkylene group connected via an oxygen group; $Z^-$ is a chloride ion or $R^8SO_3^-$; $R^2$ is a hydrogen atom or methyl group; "j" is 0; "k" is 1; and $R^8$ is C1 to C3 alkyl group.

10. The method of claim 1, the pH of the developer ranges from 11.5 to 12.5.

11. The method of claim 1, wherein the amount of the nonionic surfactant in the developer is in the range of 1% to 30% by weight.

12. The method of claim 11, wherein the amount of nonionic surfactant in the developer is in the range of 2% to 20% by weight.

* * * * *